(12) United States Patent
Velayuthan

(10) Patent No.: US 8,698,525 B2
(45) Date of Patent: Apr. 15, 2014

(54) CLOCK DIVIDER CIRCUIT

(71) Applicant: Texas Instruments Incorporated, Dallas, TX (US)

(72) Inventor: Rajesh Velayuthan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/040,697

(22) Filed: Sep. 29, 2013

(65) Prior Publication Data

US 2014/0029716 A1    Jan. 30, 2014

Related U.S. Application Data

(62) Division of application No. 13/899,318, filed on May 21, 2013, now Pat. No. 8,581,640, which is a division of application No. 13/019,309, filed on Feb. 2, 2011, now Pat. No. 8,471,608.

(51) Int. Cl.
*H03B 19/06* (2006.01)

(52) U.S. Cl.
USPC .......................... 327/118; 327/115; 327/117

(58) Field of Classification Search
USPC ................................................ 327/115, 117
See application file for complete search history.

(56) References Cited

U.S. PATENT DOCUMENTS

| | | | | |
|---|---|---|---|---|
| 6,047,382 A * | 4/2000 | Maley et al. | | 713/501 |
| 7,259,755 B1 * | 8/2007 | Ahn | | 345/204 |
| 7,813,466 B2 * | 10/2010 | Huang et al. | | 377/47 |
| 8,222,965 B1 * | 7/2012 | Juneau et al. | | 332/127 |
| 2012/0194229 A1 * | 8/2012 | Velayuthan | | 327/118 |

* cited by examiner

*Primary Examiner* — Ryan Jager
(74) *Attorney, Agent, or Firm* — John R. Pessetto; Wade J. Brady, III; Frederick J. Telecky, Jr.

(57) ABSTRACT

A clock divider circuit. The clock divider receives m input clock signals each of the same frequency. Each input clock signal after the first has a phase offset of 2π/m from the previous input clock signal. The clock divider divides the frequency of the input clock signals by an integer of division K. The clock divider includes a counter that receives the first input clock signal and provides one or more count signals. The clock divider also includes m flip-flops, of which a first flip-flop receives the first input clock signal at its clock input and provides a first clock output signal. Each flip-flop after the first receives an input clock signal at its clock input and provides a clock output signal, each clock output signal after the first having a 2πK/m phase offset from the previous clock output signal.

1 Claim, 27 Drawing Sheets

CLOCK DIVIDER CIRCUIT

This application is a Divisional of prior application Ser. No. 13/899,318, filed May 21, 2013, now U.S. 8,581,640, granted Nov. 12, 2013;

Which was a Divisional of prior application Ser. No. 13/019,309, filed Feb. 2, 2011, now U.S. Pat. No. 8,471,608, granted Jun. 25, 2013.

TECHNICAL FIELD

Embodiments of the disclosure relate to the field of clock-generation in a digital module.

BACKGROUND

A clock divider circuit is a circuit that transforms an input signal of a frequency f to an output signal of frequency (f/K), where K is an integer. Clock dividers find wide usage in digital modules that include components that require clock signals of more than one frequency. Using separate clock generators for the various required clock frequencies would result in an increase in area and complexity of the clock generator module. To avoid this problem, the clock generator module typically contains only a single clock generator that provides a clock signal having the highest frequency of any of the required clock signals. Lower frequency clock signals are obtained by means of a clock divider in the digital module. There has been a need for a clock divider that requires minimal integrated circuit surface area and that can divide multi-phase clock signals with minimal circuit complexity.

SUMMARY

A clock divider receives m input clock signals each of the same frequency. Each input clock signal after the first has a phase offset of $2\pi/m$ from the previous input clock signal. The clock divider divides the frequency of the input clock signals by an integer of division K. The clock divider includes a counter that receives the first input clock signal and provides one or more count signals. The clock divider also includes m flip-flops, of which a first flip-flop receives the first input clock signal at its clock input and provides a first clock output signal. Each flip-flop after the first receives an input clock signal at its clock input and provides a clock output signal, each clock output signal after the first having a $2\pi K/m$ phase offset from the previous clock output signal. Each flip-flop has a D input that receives a D-input signal comprising one of (1) a count signal and (2) a clock output signal from one of the other flip-flops.

A divide-by-two clock divider receives eight input clock signals each of the same frequency, a second one of the input clock signals having a phase offset of $\pi/4$ from the first one, a third one of the input clock signals having a phase offset of $\pi/4$ from the second one, and so on. The divider includes a one-bit counter that receives the first input clock signal as its clock input. A first flip-flop receives the first input clock signal as its clock input and a zero-count signal from the counter as its D input and provides a first clock output having one-half the frequency of, and the same phase as, the first input clock signal. A second flip-flop that receives the third input clock signal as its clock input and the first clock output as its D input and provides a second clock output having the same frequency as, and a phase offset of $\pi/2$ from, the first clock output. A third flip-flop that receives the fifth input clock signal as its clock input and the first clock output as its D input and provides a third clock output having the same frequency as, and a phase offset of $\pi$ from, the first clock output. A fourth flip-flop that receives the seventh input clock signal as its clock input and the first clock output as its D input and provides a fourth clock output having the same frequency as, and a phase offset of $3\pi/2$ from, the first clock output. A fifth flip-flop that receives the first input clock signal as its clock input and a one-count signal from the counter as its D input and provides a fifth clock output having the same frequency as, and a phase offset of $2\pi$ from, the first clock output. A sixth flip-flop that receives the third input clock signal as its clock input and the fifth clock output as its D input and provides a sixth clock output having the same frequency as, and a phase offset of $5\pi/2$ from, the first clock output. A seventh flip-flop that receives the fifth input clock signal as its clock input and the fifth clock output as its D input and provides a seventh clock output having the same frequency as, and a phase offset of $3\pi$ from, the first clock output and an eighth flip-flop that receives the seventh input clock signal as its clock input and the fifth divided output as its D input and provides an eighth clock output having the same frequency as, and a phase offset of $7\pi/2$ from, the first clock output.

A divide-by-three clock divider receives eight input clock signals each of the same frequency, each input clock signal after the first having a phase offset of $\pi/4$ from the previous input clock signal. The clock divider includes a counter that receives the first input clock signal. A first flip-flop that receives the first input clock signal as its clock input and a zero-count signal from the counter as its D input and provides a first clock output. A second flip-flop that receives the fourth input clock signal as its clock input and the first clock output as its D input and provides a second clock output. A third flip-flop that receives the seventh input clock signal as its clock input and the first clock output as its D input and provides a third clock output. A fourth flip-flop that receives the second input clock signal as its clock input and a two-count signal from the counter as its D input and provides a fourth clock output. A fifth flip-flop that receives the fifth input clock signal as its clock input and the fourth clock output as its D input and provides a fifth clock output. A sixth flip-flop that receives the eighth input clock signal as its clock input and the fourth clock output as its D input and provides a sixth clock output. A seventh flip-flop that receives the third input clock signal as its clock input and the fourth clock output as its D input and provides a seventh clock output and an eighth flip-flop that receives the sixth input clock signal as its clock input and the seventh clock output as its D input and provides an eighth clock output, each clock output after the first having a phase offset of $\pi/4$ from the previous clock output.

Another divide-by-three clock divider that receives eight input clock signals each of the same frequency, each clock signal after the first having a phase offset of $\pi/4$ from the previous clock signal. A counter that receives the first input clock signal. A first flip-flop that receives the first input clock signal as its clock input and a sixth clock output as its D input and provides a first clock output. A second flip-flop that receives the fourth input clock signal as its clock input and a one-count signal from the counter as its D input and provides a second clock output. A third flip-flop that receives the seventh input clock signal as its clock input and the second clock output as its D input and provides a third clock output. A fourth flip-flop that receives the second input clock signal as its clock input and a two-count signal from the counter as its D input and provides a fourth clock output. A fifth flip-flop that receives the fifth input clock signal as its clock input and the fourth clock output as its D input and provides a fifth clock output. A sixth flip-flop that receives the eighth input clock signal as its clock input and the fourth clock output as its D input and provides the sixth clock output. A seventh flip-flop that receives the third input clock signal as its clock input and a zero-count signal from the counter as its D input and provides a seventh clock output and an eighth flip-flop that receives the sixth input clock signal as its clock input and the seventh clock output as its D input and provides an eighth clock output, each clock output after the first having a phase offset of $\pi/4$ from the previous clock output.

DETAILED DESCRIPTION

Figure 1:
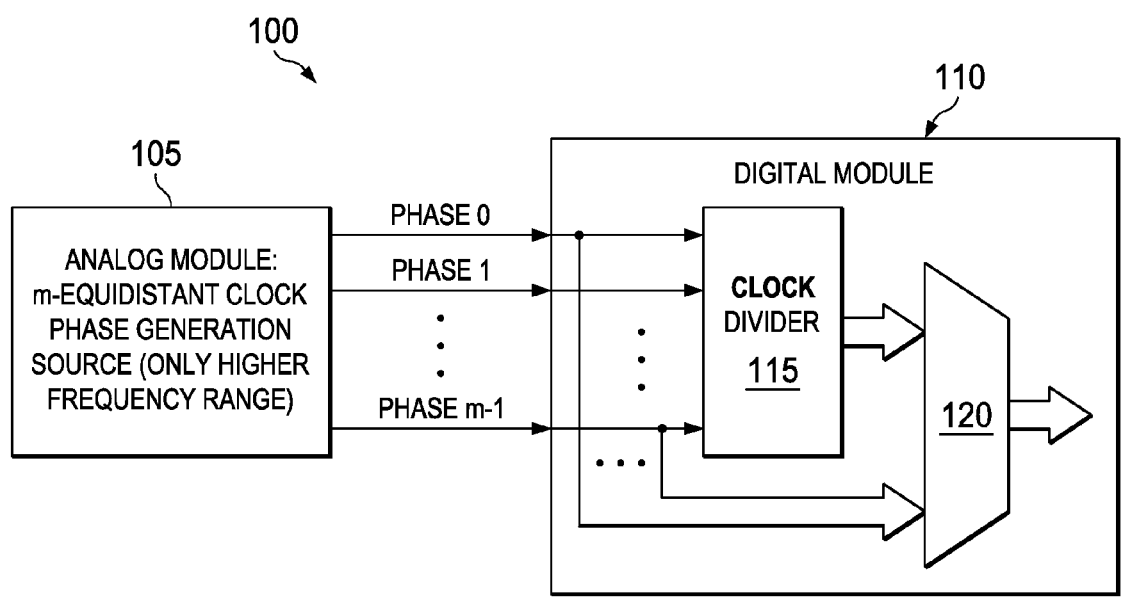
FIG. 1 is a block diagram illustrating an environment, in accordance with which various embodiments can be implemented.

FIG. 1 is a block diagram illustrating an environment, in accordance with which various embodiments can be implemented. The environment includes a clock source 105 for generating clock signals. The clock source is an analog module. The environment also includes a digital module 110. The digital module is operable to receive the clock signals. The digital module includes a clock divider 115 and a multiplexer 120 for generating equidistant clock phases of different frequencies using the clock signals received from the clock source 105.

In an embodiment, the clock source 105 generates a set of input clock signals of the same frequency and whose rising edges are offset equally in time ("equidistant phases"). The input clock signals are received by the clock divider circuit 115 of the digital module 110. The clock divider 115 in conjunction with the multiplexer 120 transforms the input clock signals to output another set of clock signal with time-offsets of the rising edges of the output clock signals at a specified integral multiple of the time-offsets of the input clock signals. Further, the frequency of the input clock signals is the same integral multiple of the frequency of the output clock signals. For example, the input clock signals correspond to higher frequencies and the output clock signals correspond to lower frequencies. The clock divider 115 is operable to generate multiple equidistant clock phases of different frequencies.

Figure 2:
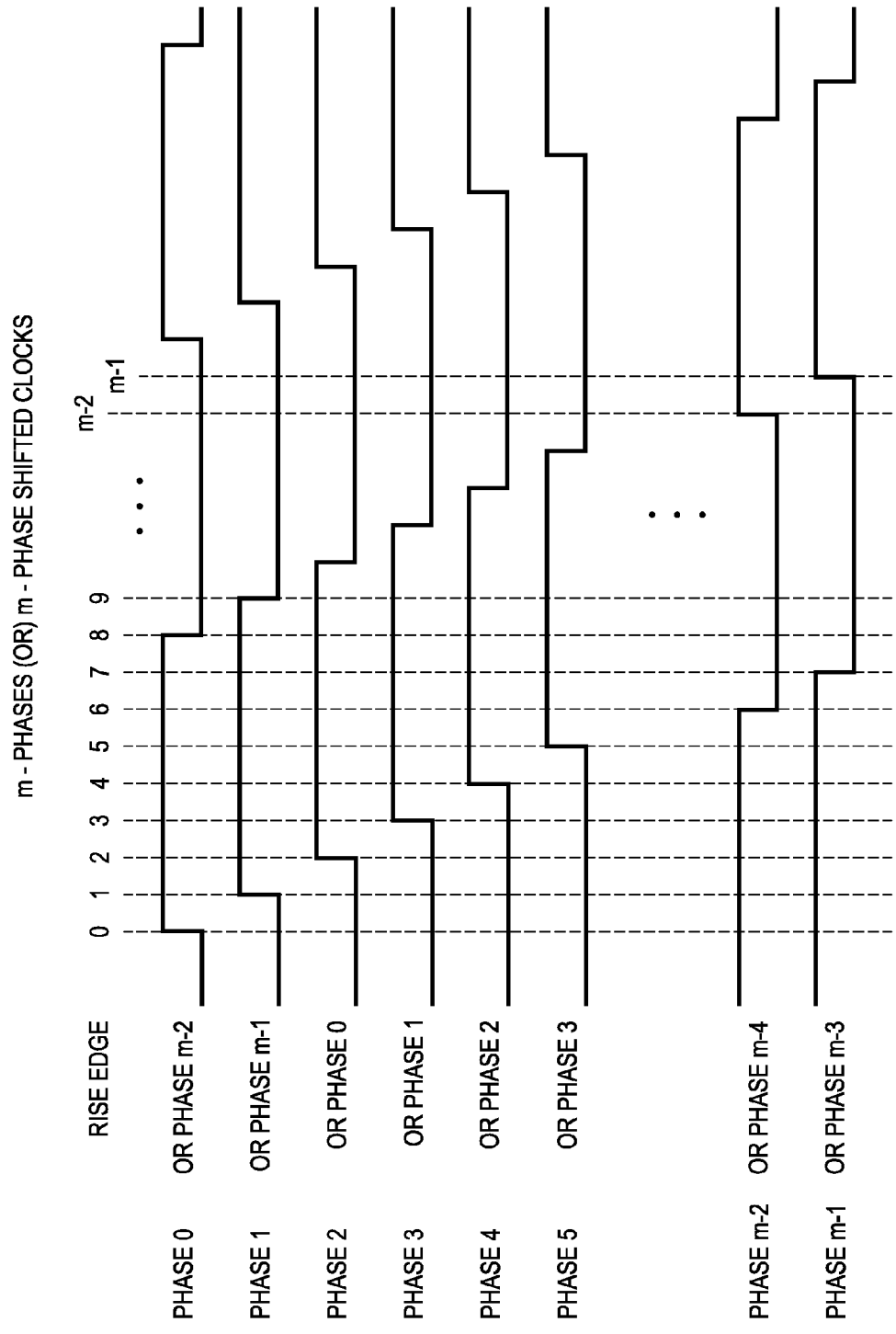
FIG. 2 is an exemplary illustration of m clock signals all of the same frequency, each signal after the first being phase-shifted from the phase of the previous one by 1/m of a period.

FIG. 2 illustrates m equidistant clock phases. The set of clocking waveforms are of the same frequency and their rising edges are offset equally in time ("equidistant phases"). In one example, consider a first phase as 'phase 0' and successive phases are named in increasing order (phase 2, phase 3 . . . phase m−1). Hereinafter, the word "phase" and "Ph" have been used interchangeably.

In one embodiment of a frequency divider circuit, the frequency of each phase-shifted clock signal is divided by a dividing factor. This is the same as multiplying the period of the signal by that same factor. The phase shifted clocks will have equidistant phases. Examples of the divided phase shifted clocks are explained in conjunction with FIG. 3, FIG. 4 and FIG. 5.

Figure 3:
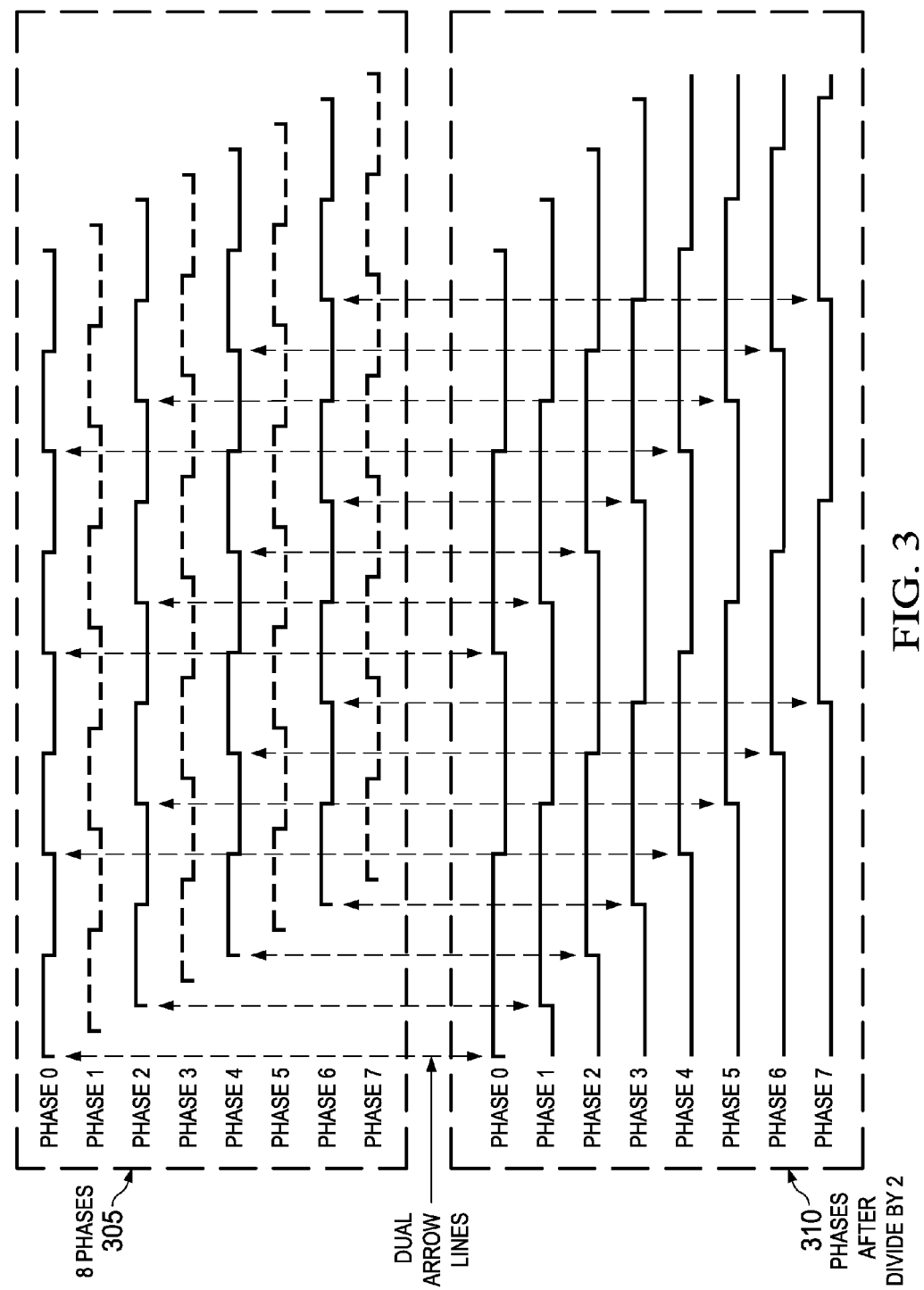
FIG. 3 is an exemplary illustration of a divide-by-two operation on 8 clock signals all of the same frequency, each signal after the first being phase-shifted from the phase of the previous one by 1/8 of a period.

As in FIG. 3, 8 phase shifted clocks (305) input to a divider circuit is shown. When divided by 2, the frequency of each phase-shifted clock signal is divided by a dividing factor or clock period of each phase shifted clocks are multiplied by the same factor 2 and will have m-equidistant phases (310), where m is the number of input phases to the divider circuit.

For example, the rising edge of Phase 0 (310) corresponds to first rising edge of phase 0 (305). Further, the rising edge of Phase 1 (310) corresponds to first rising edge of phase 2 (305) and the phase difference of the former from Phase 0 (310) is twice as large as the phase difference of the latter from Phase 0 (305). Similarly, the rising edges of phase 2 (310) and phase 3 (310) correspond to first rising edges of phase 4 (305) and phase 6 (305) respectively. Also, clock divided phase 4 (310), phase 5 (310), phase 6 (310) and phase 7 (310) correspond to second rising edges of phase 0 (305), phase 2 (305), phase 4 (305) and phase 6 (305) respectively. Further, the phase difference of consecutive 8-equidistant phases 310 is twice the phase difference of consecutive phase shifted clocks (305).

Figure 4:
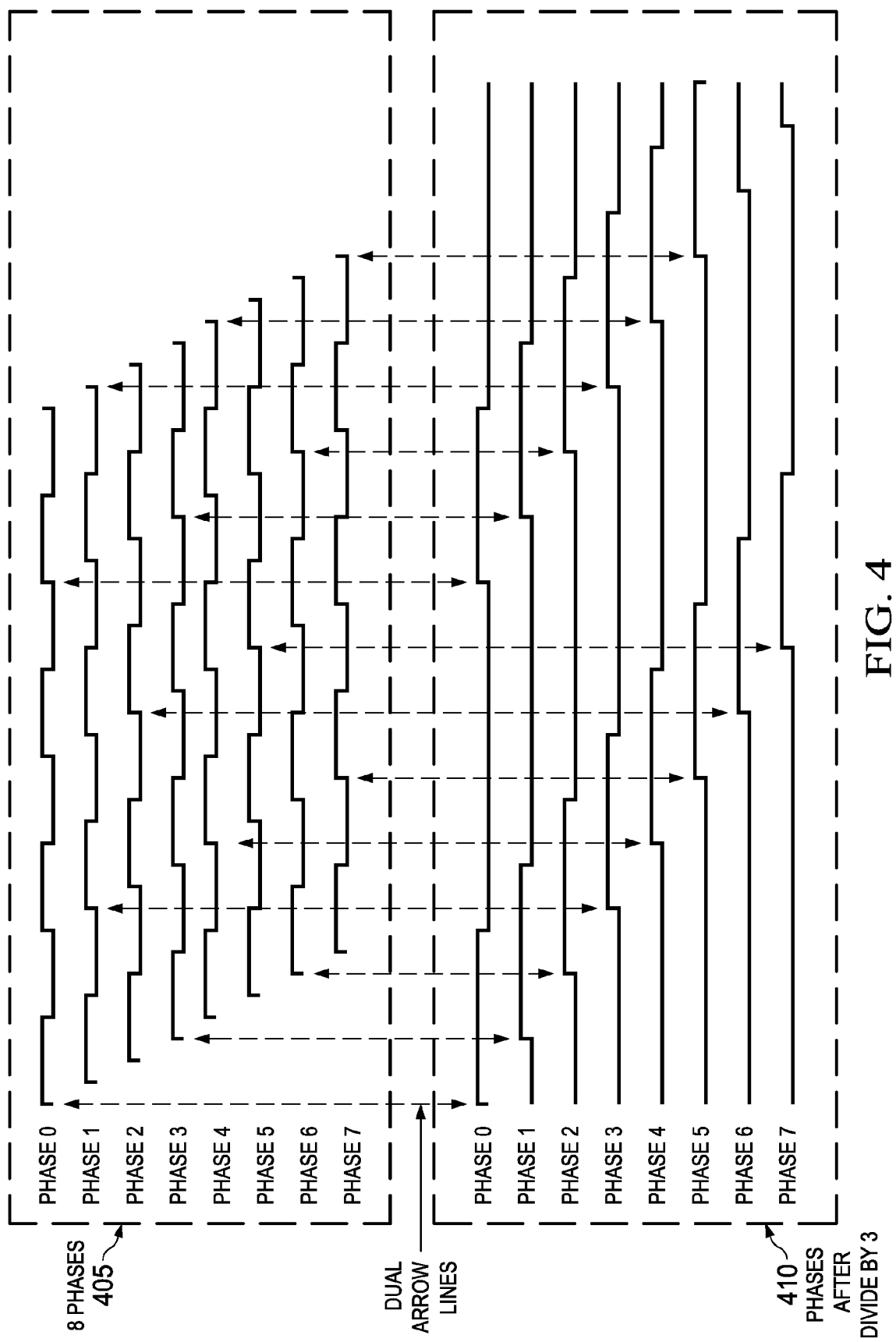
FIG. 4 is an exemplary illustration of a divide-by-three operation on 8 clock signals all of the same frequency, each signal after the first being phase-shifted from the phase of the previous one by 1/8 of a period.

As in FIG. 4, 8 phase shifted clocks (405) input to a divider circuit is shown. When divided by 3, the frequency of each phase-shifted clock signal is divided by a dividing factor 3 or clock period of each phase shifted clocks are multiplied by the same factor 3 and will have 8-equidistant phases (410).

For example, the rising edge of phase 0 (410) corresponds to first rising edge of phase 0 (405). Further, the rising edge of phase 1 (410) corresponds to first rising edge of phase 3 (405) and the phase difference of the former from Phase 0 (410) is thrice as large as the phase difference of the latter from Phase 0 (405). Similarly, the rising edges of phase 2 (410) and phase 3 (410) correspond to first rising edge of phase 6 (405) and second rising edge of phase 1 (405) respectively. Also, clock divided phase 4 (410), phase 5 (410), phase 6 (410) correspond to second rising edge of phase 4 (405), phase 7, (405) and third rising edge of phase 2 (405) respectively. The clock divided phase 7 (410) correspond to third rising edge of phase 5 (405). Further, the phase difference of consecutive 8-equidistant phases 410 is thrice the phase difference of consecutive phase shifted clocks (405).

Figure 5:
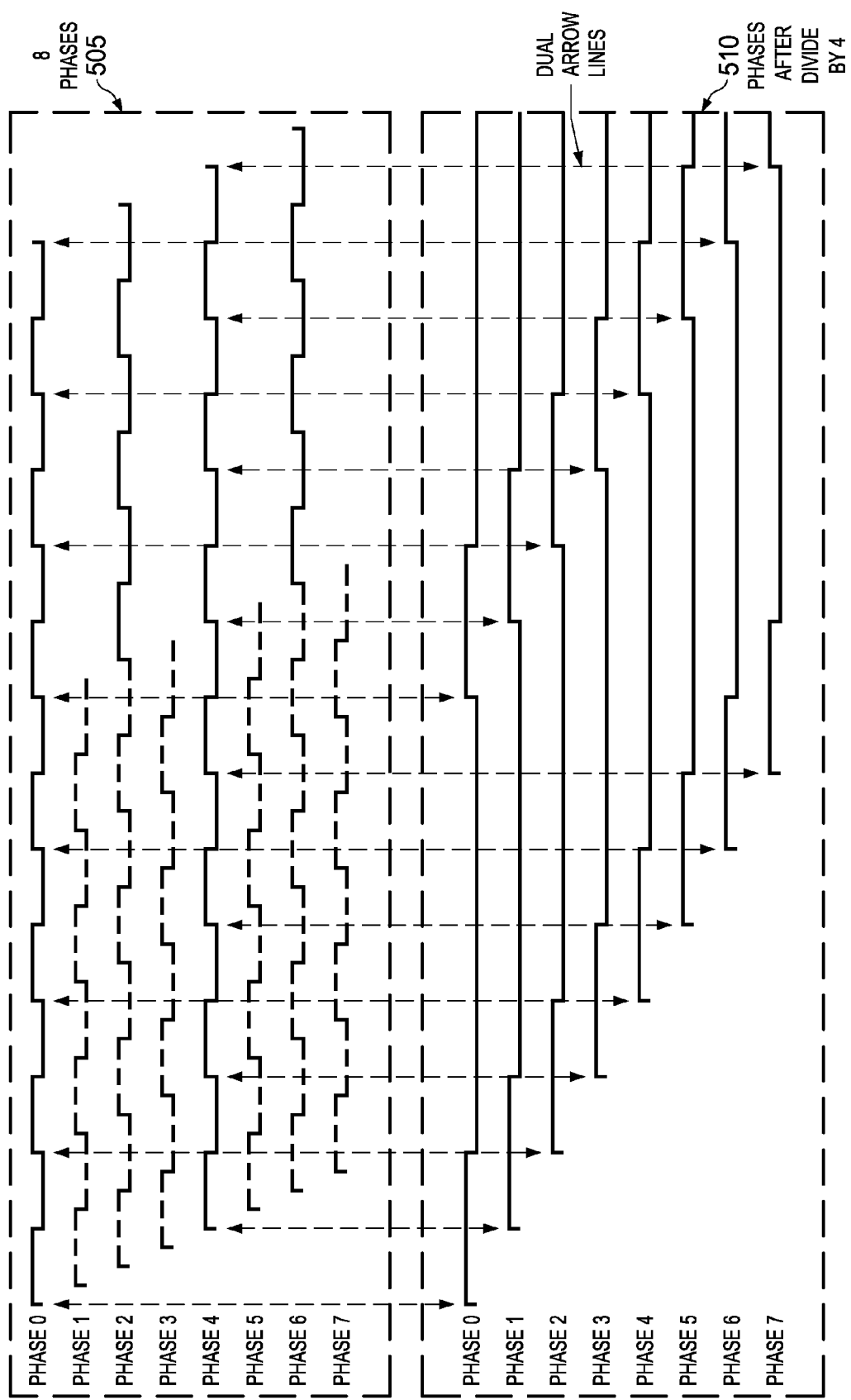
FIG. 5 is an exemplary illustration of a divide-by-four operation on 8 clock signals all of the same frequency, each signal after the first being phase-shifted from the phase of the previous one by 1/8 of a period.

As in FIG. 5, 8 phase shifted clocks (505) input to a divider circuit is shown. When divided by 4, the frequency of each phase-shifted clock signal is divided by a dividing factor 4 or clock period of each phase shifted clocks are multiplied by the same factor 4 and will have 8-equidistant phases (510).

For example, the rising edge of phase 0 (510) corresponds to first rising edge of phase 0 (505). Further, the rising edge of phase 1 (510) corresponds to first rising edge of phase 4 (505) and the phase difference of the former from Phase 0 (510) is twice as large as the phase difference of the latter from Phase 0 (505). Similarly, the rising edges of phase 2 (510) and phase 3 (510) correspond to second rising edges of phase 0 (510) and phase 4 (510) respectively. The rising edges of clock divided phase 4 (510) and phase 5 (510) correspond to third rising edges of phase 0 (505) and phase 2 (505) respectively. The rising edges of clock divided phase 6 (510) and phase 7 (510) correspond to fourth rising edge of phase 0 (505) and phase 4 (505) respectively. Further, the phase difference of consecutive 8-equidistant phases 510 is thrice the phase difference of consecutive phase shifted clocks (505).

Figure 6:
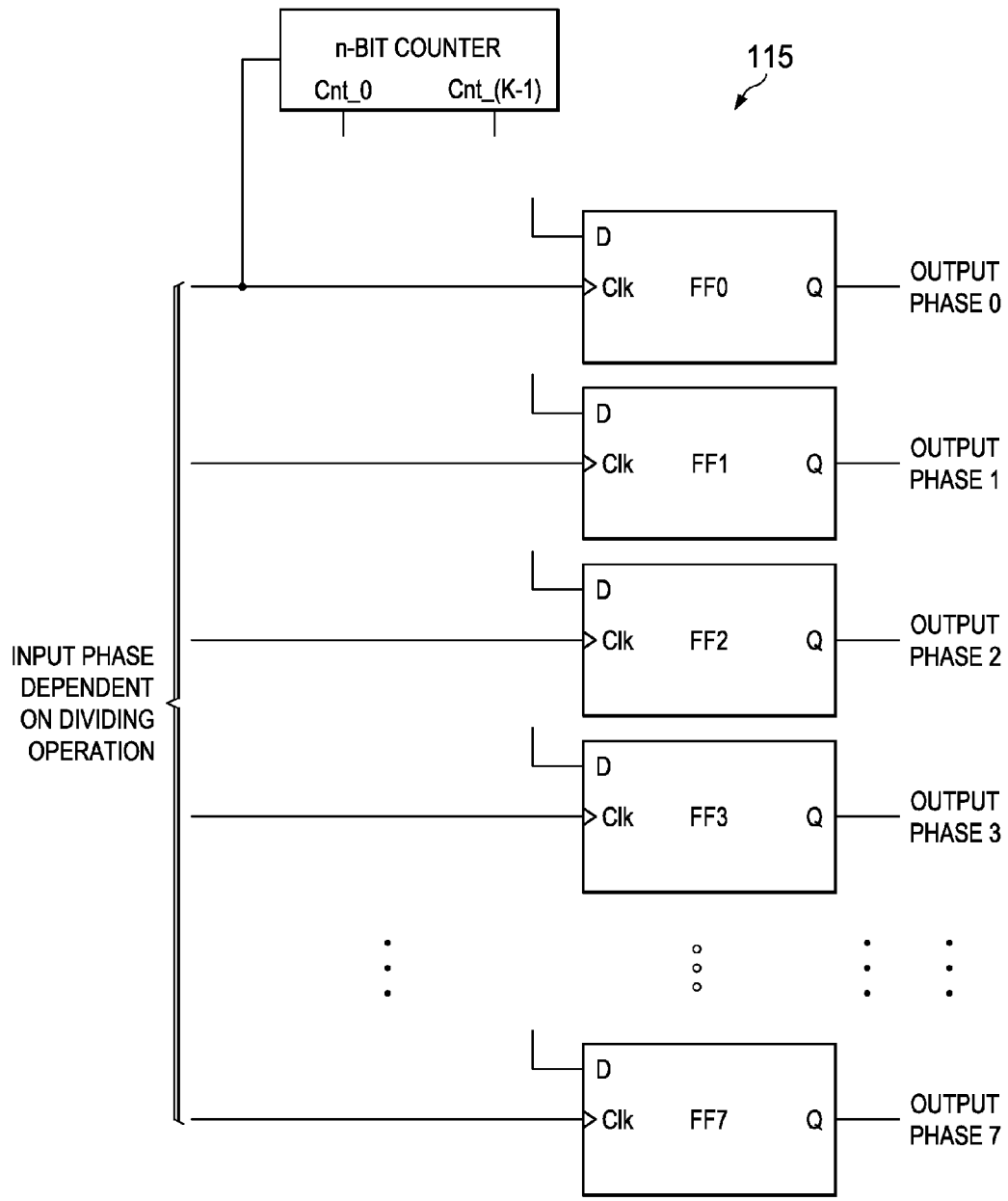
FIG. 6 is a block diagram of a clock divider circuit, in accordance with which various embodiments can be implemented.

As in FIG. 6, a clock divider circuit 115 is shown in accordance with which various embodiments are implemented.

Consider a number of input clock signals generated by the clock source 105 as 'm'. The input clock signals are herein referred to as input phases. In any clock dividing operation, the number of input phases is equal to the number of output clock signals. The output clock signals are herein referred to as output phases. The ratio of frequency of input phases to the frequency of the output phases is denoted by an integer 'K'. The 'm' input phases are labeled from '0' to (m−1) in the successive order of their phases, with first phase being arbitrarily chosen. Here, the clock divider circuit 115 receives the 'm' input phases to achieve desired frequency division.

In an embodiment, the clock divider circuit 115 has as many D-flip-flops as there are output waveforms, and the Q-output of the $i^{th}$ D-flip-flop serves as the $i^{th}$ output phase. The $i^{th}$ (i going from 0 to m−1) D-flip-flop is clocked by the input phase with label (iK) mod m. For example, consider m=8 and K=3, so that the i=4th output D-flip-flop will be clocked by input phase with label (4×3) mod 8=4.

Figure 7:
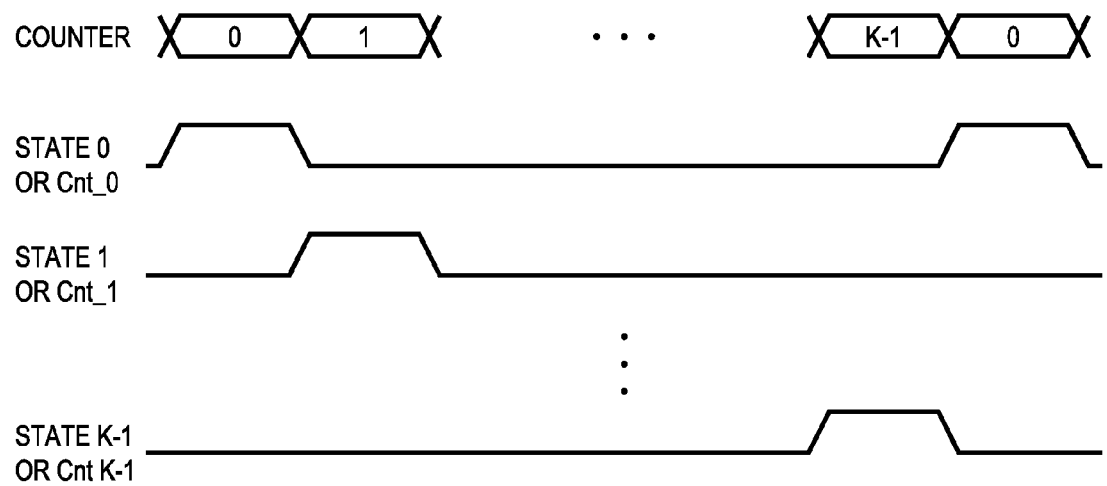
FIG. 7 is a exemplary illustration of pulsed waveforms of a K-bit counter.

The clock divider circuit 115 includes a counter that generates K pulsed waveforms offset in time, as shown in FIG. 7. The counter has n=ceil($\log_2$K) bits, and is clocked by the input phase with label "0." The K pulsed waveforms generated by the counter are denoted as cnt_0, cnt_1 ... cnt_(K−1). Herein, cnt_0 is also referred as zero count, cnt_1 is also referred as one count, cnt_2 is also referred as two count and so on.

The clock divider circuit 115 can performs frequency division of the input phases to generate the output phases using 3 methods.

Method 1

As discussed herein, m-equidistant input phases are input to the clock divider circuit 115. A division factor or ratio of input to output phase frequency is denoted as 'K'. Hence, m-equidistant output phases whose frequency is reduced by a division factor K is to be generated.

The number of flip-flops is equal to number of phases, i.e 'm' flip-flops. Clock input signal to each flip-flop is as follows:

FF 0 is clocked always by Input phase 0
FF 1 is clocked by Input phase[modulo m of K*1]
FF 2 is clocked by Input phase[modulo m of K*2]
FF m−1 is clocked by Input phase [modulo m of K*(m−1)], where (m−1) refers to a label of the flip-flop and K is the division factor. Alternatively, FF0 can be considered as a first flip-flop, FF1 as a second flip-flop and FF (m−1) as $m^{th}$ flip-flop.

The input phase 0 acts as a clocking signal to the counter. In an embodiment, the waveforms generated by the counter are used to input the flip-flops.

Initially, the output phases to be generated are classified into sets denoted by 'S'. The number of sets is determined as S=min(K, m). For K<=m, K sets are formed. For K>m, m sets are formed. The maximum number of output phases in each set is determined as p=Ceil(m/K). In one embodiment, the number of output phases in an individual set is no greater than 'p' and greater than or equal to unity. The first output phase associated with a first set among the sets 'S' can be any output phase, and rest of the output phases in the first set and the subsequent sets will be successive phases. For example: for division factor K=3 and phases m=8, the number of sets S=3. The sets being denoted as S={S1, S2 and S3}. Considering the 'output phase 0' as the first output phase in the set S1, the sets S are classified as:

S1={output phase 0, output phase 1, output phase 2}
S2={output phase 3, output phase 4, output phase 5}
S3={output phase 6, output phase 7}

Few examples of set formation for a given m and K values that are consistent with the above rules are as follows:

m=8,K=3: S1{0,1,2}, S2{3,4,5}, S3{6,7} m=8,K=3: S1{1,2},S2{3,4,5},S3{6,7,0}
m=8,K=3: S1{1,2,3}, S2{4,5,6}, S3{7,0}
m=8,K=6: S1{2,3},S2{4,5},S3{6},S4{7},S5{0},S6{1}
m=12,K=5: S1{0,1,2},S2{3,4,5},S3{6,7},S4{8,9}, S5{10,11}
m=12,K=5: S1{3,4},S2{5,6,7},S3{8,9},S4{10,11},S5{0,1,2} where {0,1,2,3,4,5,6,7,8,9,10,11,12} are output phases.

Let us consider the waveforms generated by the counter as cnt_0, cnt_1 and cnt_(K−1). The rules used in connecting the counter waveforms are as follows:

Denote the first element of a set by 'n'. Then the D-flip-flop with label 'n' is latched by (i.e., its D-input connected to) counter waveform cnt_z, with 'z' chosen as z=(ceil(nK/m)) mod K.

The D-flip-flop of the remaining (non-first) elements of a set are latched by the Q-output of the first D-flip-flop in that set, or, alternatively;

the D-flip-flops of the remaining (non-first) elements of a set are latched by the Q-output of the immediately previous D-flip-flop in that set.

Figure 8:
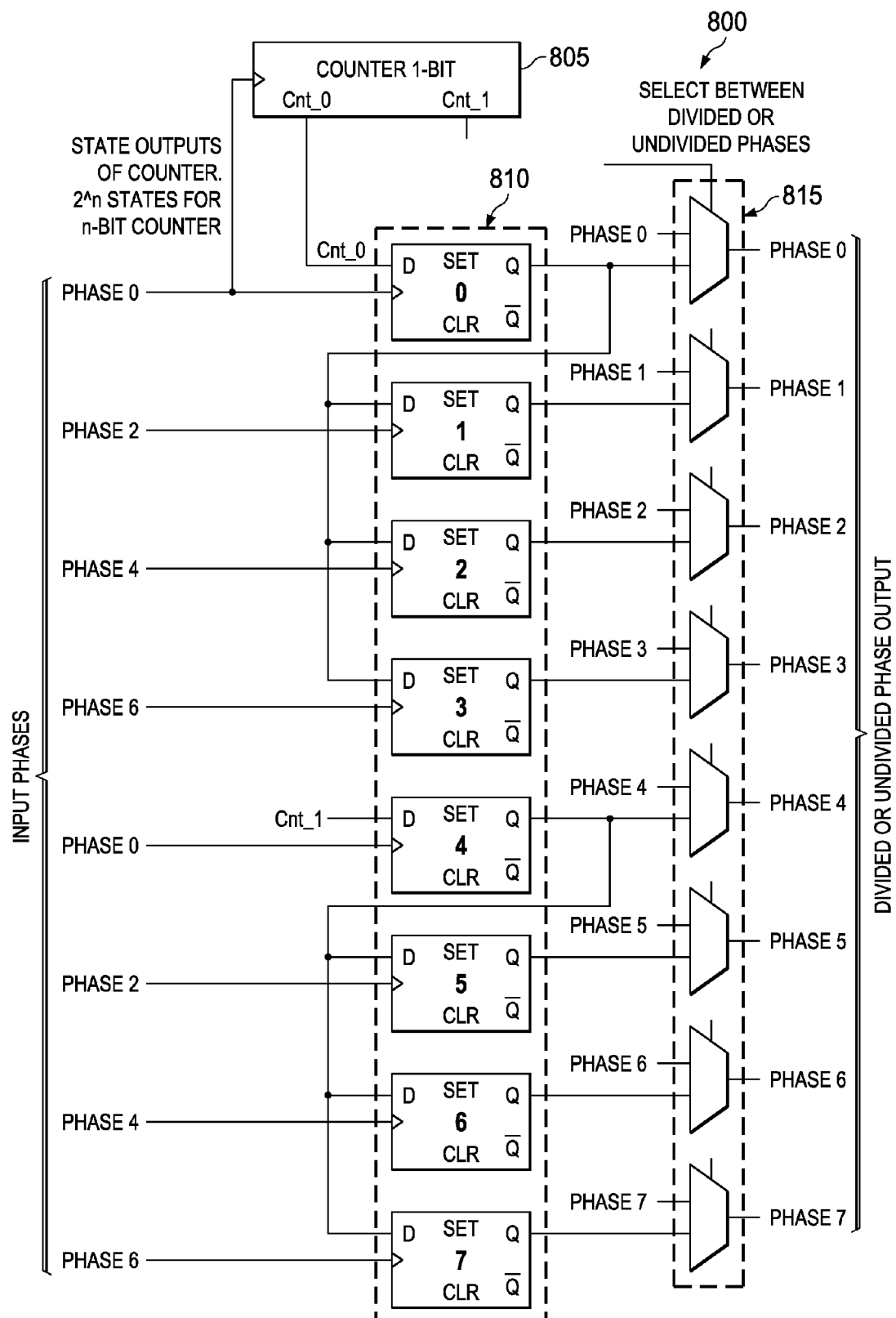
FIG. 8 is a block diagram of a divide-by-two clock divider circuit, in accordance with one embodiment.

An exemplary illustration of a circuit employing method 1 is explained in FIG. 8.

Method 2

As discussed herein, m-equidistant input phases are input to the clock divider circuit 115. A division factor or ratio of input to output phase frequency is denoted as 'K'. Hence, m-equidistant output phases whose frequency is reduced by a division factor K is to be generated.

The number of flip-flops is equal to number of phases, i.e 'm' flip-flops. Clock input signal to each flip-flop is as follows:

FF 0 is clocked always by Input phase 0
FF 1 is clocked by Input phase[modulo m of K*1]
FF 2 is clocked by Input phase[modulo m of K*2]
FF m−1 is clocked by Input phase [modulo m of K*(m−1)], where (m−1) refers to a label of the flip-flop and K is the division factor.

The input phase 0 acts as a clocking signal to the counter. In an embodiment, the waveforms generated by the counter are used to input the flip-flops.

Initially, the output phases to be generated are classified into sets denoted by 'S'. The number of sets is determined as S=min(K, m). For K<=m, K sets are formed. For K>m, m sets are formed. The maximum number of output phases in each set is determined as p=Ceil(m/K). In one embodiment, the number of output phases in an individual set is less than 'p'.

For each flip-flop, a z-value is determined. The z-value=z=(ceil(nK/m)) mod K, where n is the label associated with the flip-flop. All output waveforms with the same z-value form a set.

In one example, for division factor K=3 and phases m=8, the number of sets S=3. The sets being denoted as S={S1, S2 and S3}.

| | Output Waveform Label (n) | | | | | | | |
|---|---|---|---|---|---|---|---|---|
| | 0 | 1 | 2 | 3 | 4 | 5 | 6 | 7 |
| z-value | 0 | 1 | 1 | 2 | 2 | 2 | 0 | 0 |

Thus in this case the sets are S1={output phase 1, output phase 2}, S2={output phase 3, output phase 4, output phase 5} and S3={output phase 6, output phase 7, output phase 0}

In another example, for division factor K=9 and phases m=13, the number of sets S=9. The sets being denoted as S={S1, S2, S3, S4, S5, S6, S7, S8, S9}.

| | Output Waveform Label (n) | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| z-value | 0 | 1 | 2 | 3 | 3 | 4 | 5 | 5 | 6 | 7 | 7 | 8 | 0 |

Thus in this case the sets are S1={output phase 12, output phase 0}, S2={output phase 1}, S3={output phase 2}, S4={output phase 3, output phase 4}, S5={output phase 5}, S6={output phase 6, output phase 7}, S7={output phase 8}, S8={output phase 9, output phase 10} and S9={output phase 11}

Having formed the sets of output phases, Method 2 now simply calls for driving the D-flip-flop with label n with its corresponding cnt_z waveform. An exemplary illustration of a circuit employing method 2 is explained in FIG. 16.

Method 3

The method 3 can only be implemented for the case K<=m.

As discussed herein, m-equidistant input phases are input to the clock divider circuit 115. A division factor or ratio of input to output phase frequency is denoted as 'K'. Hence, m-equidistant output phases whose frequency is reduced by a division factor K is to be generated.

The number of flip-flops is equal to number of phases, i.e 'm' flip-flops. Clock input signal to each flip-flop is as follows:

FF 0 is clocked always by Input phase 0
FF 1 is clocked by Input phase[modulo m of K*1]
FF 2 is clocked by Input phase[modulo m of K*2]
FF m−1 is clocked by Input phase[modulo m of K*(m−1)], where (m−1) refers to a label of the flip-flop and K is the division factor.

The input phase 0 acts as a clocking signal to the counter. The FF0 is latched to a cnt_0 of the counter. Further, Q output of the FF0 is latched to the D-input of FF1. Similarly, each Q output of the flip-flop is latched to the D-input of subsequent flip-flop. An exemplary illustration of a circuit employing method 3 is explained in FIG. 20.

In some embodiments, the clock drives and D-inputs for the flip-flops of the clock divider circuit 115 can be programmed for different division factor using two sets of multiplexer. A first set of multiplexers is operable to receive input phases from a clock generator and a second set of multiplexers is operable to receive counter waveforms from the n-bit counter. Output from each multiplexer among the first set of multiplexers is fed as clock input to the set of flip-flops and output from each multiplexer among the first set of multiplexers is fed to D input of the set of flip-flops. Output from the each set of multiplexers is based on the select inputs of the individual multiplexer. The select inputs are in turn based on the divider bits or division factor. An exemplary circuit is explained in conjunction with FIG. 24.

As shown in FIG. 7, K-periodic states are generated by a counter. The number of states is based on a division factor K. To generate the K-periodic states, number of counter bits required=Ceil($\log_2$K).

The counter waveform shows the K-states generated. The waveforms corresponding to the state0, state1 and state(k−1) show the individual instances of state values generated.

As in FIG. 8, a clock divider circuit 800 for performing a divide by 2 operation is shown. The clock divider circuit 800 includes a counter 805, a group of flip-flops 810 and a corresponding set of 2:1 multiplexers 815.

The number of input phases is given as m=8 and the division factor K=2. The 8 input and output phases are identified as (Ph0, Ph1, Ph2 . . . . Ph7). The counter 805 is a 1-bit counter with states cnt_0 and cnt_1 since c=[ceil (log$_2$K)]=1 bit. For 8 input phases, the group of flip-flops 810 include 8 flip-flops labeled as FF{0, 1, 2 . . . 7}.

The clock inputs to each flip-flop is determined using [(K* (FF_label) MOD m)], where FF_label refers to the label of each flip-flop, for example a first flip-flop in the figure has a label '0'. Thereby, the input phases to successive flip-flops among the group of flip-flops 810 are given as (Ph0, Ph2, Ph4, Ph6, Ph0, Ph2, Ph4, Ph6). Using such a sequence, the phase difference of the output phases at Q output of each flip-flop is multiplied by a factor of 2. Further, the counter 805 is clocked by the first input phase, i.e Ph0.

One of the states of the counter 805 is latched to one or more flip-flops of the set of flip-flops 810. Input to be latched to each flip-flop is determined by grouping one or flip-flops in sets and associating the state to each sets. The number of sets is equal to [min(K, m)=2]. The maximum number of flip-flops associated with a single set is determined as p=(Ceil(m/K))=4. Further, each set includes flip-flops that have consecutive labels. In the illustration of FIG. 8, the sets are classified as S1={0,1,2,3} and S2={4,5,6,7}, where {0,1,2,3,4,5,6,7} refers to the labels of the flip-flops. The state to be latched to each set is determined using z=(ceil(nK/m)) mod K, where z refers to the count state, n refers to the first label in each set.

Figure 9:
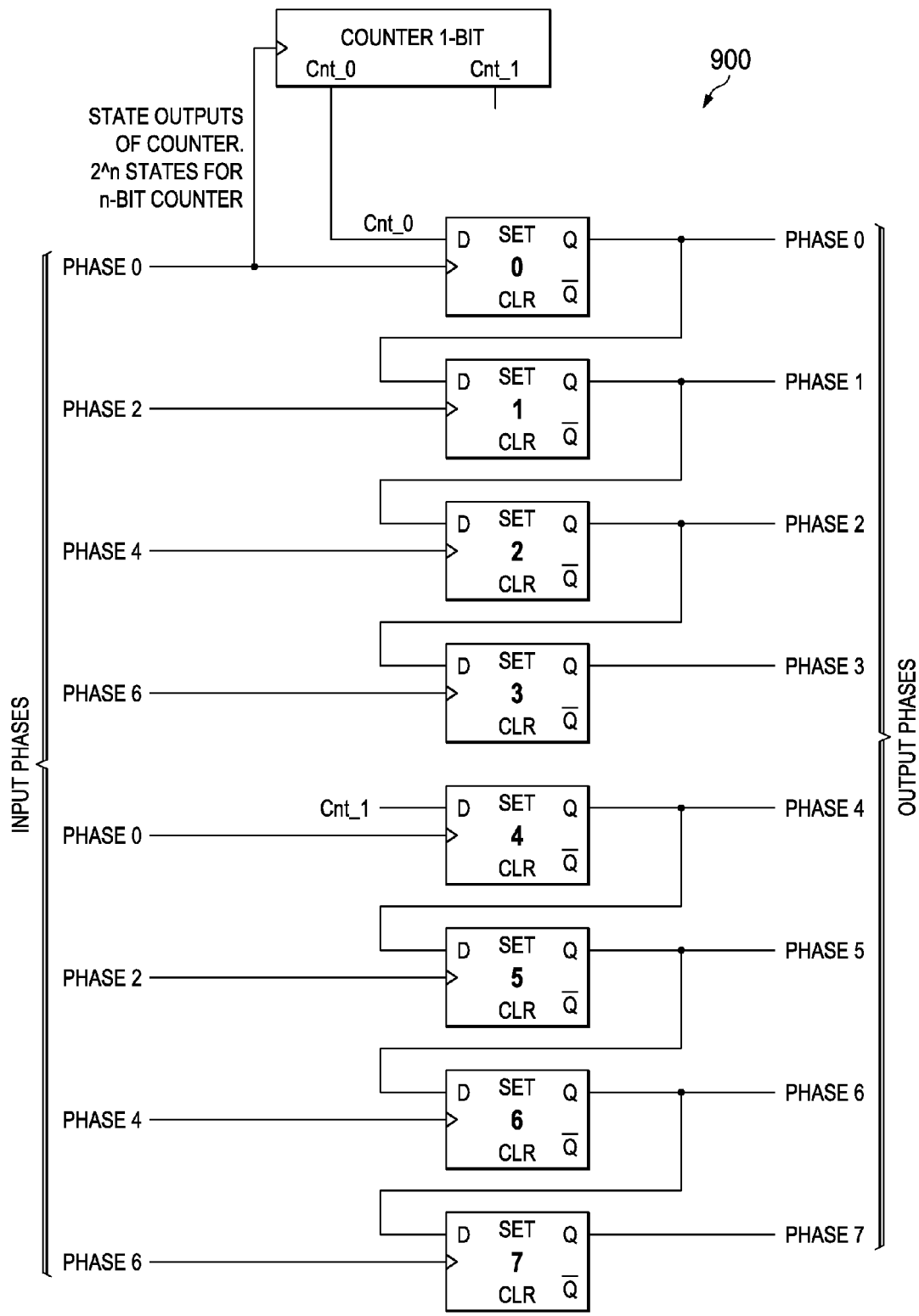
FIG. 9 is a block diagram of a divide-by-two clock divider circuit in accordance with another embodiment.

For set S1, the counter state is determined as cnt_0. For set S2, the counter state is determined as cnt_1. Consecutively for set S1, D input of the first flip-flop labeled {0} is latched to a first state or cnt_0. Further, the D inputs of the remaining flip-flops classified in the Set S1 latches to a Q output of the first flip-flop labeled {0}. In some embodiments, the D inputs of the remaining flip-flops classified in the Set S1 latches to Q outputs of the previous flip-flop in the Set S1 (as shown in FIG. 9). Similarly, for set S2, D input of the flip-flop labeled {4} is latched to a second state or cnt_1. Further, the D inputs of the remaining flip-flops classified in the Set S2 latches to a Q output of the flip-flop labeled {4}. In some embodiments, the D inputs of the remaining flip-flops classified in the Set S2 latches to Q outputs of the previous flip-flop in the Set S2 (as shown in FIG. 9). Utilizing the counter states as D-input as mentioned herein results in the clock period of output phases multiplied by a factor 2.

The flip-flops labeled {0,1,2,3,4,5,6,7} output a divided output phases {Ph0, Ph1, Ph2, Ph3, Ph4, Ph 5, Ph6, Ph7} respectively. The phase difference clock period of the output phases are multiplied by the factor 2.

In an embodiment, the clock divider circuit 800 can be operable to perform selection of divided or undivided phases (input phases) using the set of 2:1 multiplexers 815. Each divided output phase is input to a first input of a 2:1 multiplexer individually by coupling the Q output of the flip-flops to the first input of the set of 2:1 multiplexers 815. A second input of the set of 2:1 multiplexers 815 receives the undivided phases (input phases) as input. A select line to the multiplexer can be used in selecting either of the first input or the second input.

The clock divider circuit 900 of FIG. 9 illustrates a divide by 2 operation, in accordance with a second embodiment. The operation of the clock divider circuit 900 is similar to the clock divider circuit 800 in FIG. 8. However, during selection of counter states for each set, D input of the first flip-flop in the state is latched to a respective count. For example, flip-flop labeled {0} of set S1 is latched to cnt_0 and the flip-flop labeled {4} of set S2 is latched to cnt_0. The D inputs of the remaining flip-flops classified in a set latches to Q outputs of the previous flip-flop in that set.

Figure 10:
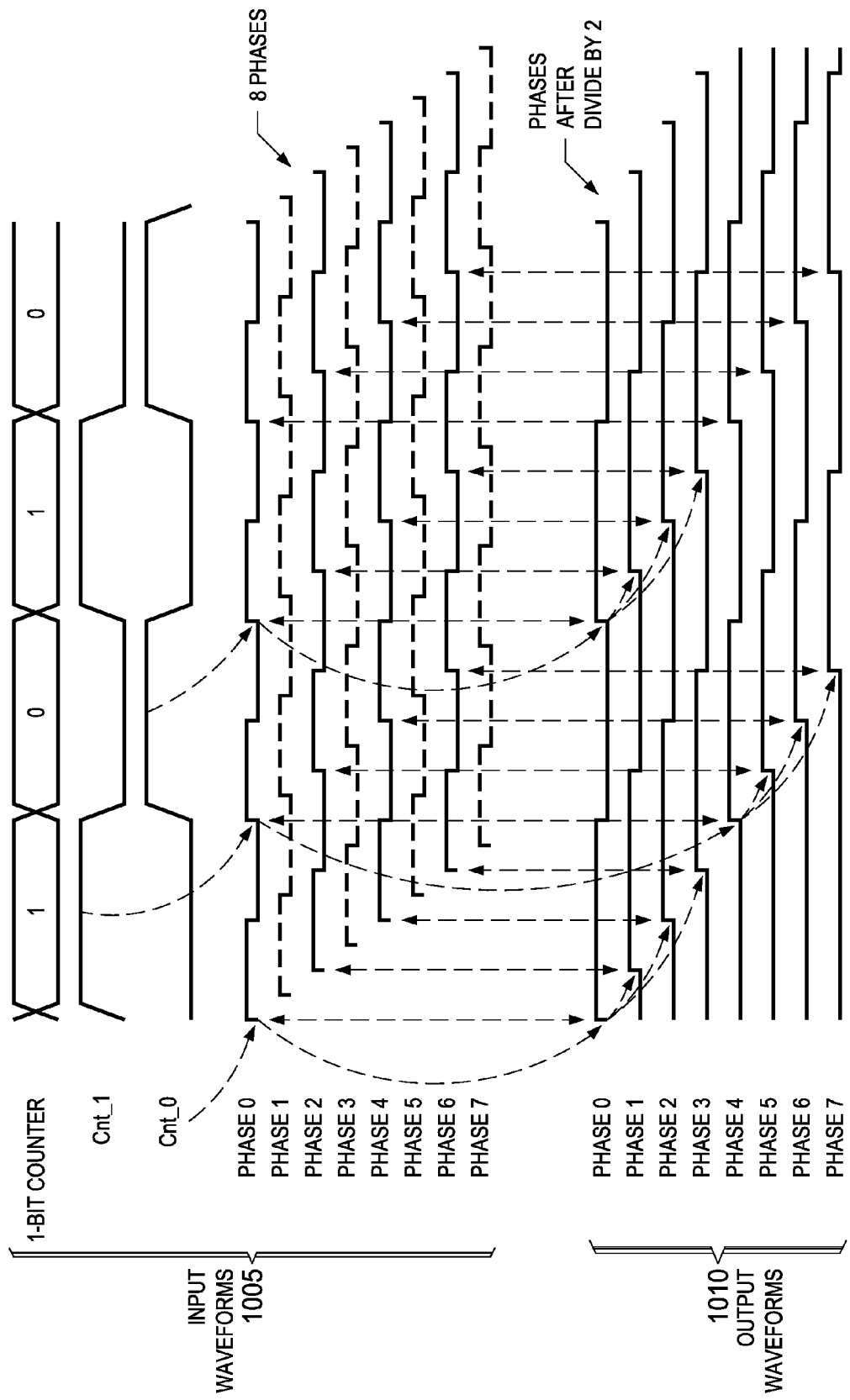
FIG. 10 is an illustration of a divide-by-two operation on 8 clock signals all of the same frequency, each signal after the first being phase-shifted from the phase of the previous one by 1/8 of a period.

FIG. 10 is an illustration of a divide-by 2 m-equidistant phase clock signals for the clock divider circuit 800.

The upper half of the FIG. 10 represents input waveforms 1005 to divide by 2 clock divider circuits, and the lower half represents output waveforms 1010 from the divide by 2 clock divider circuits. The input waveforms 1005 include signal generated from a 1-bit counter, signals corresponding to individual states of the 1-bit counter (cnt_0 and cnt_1) and 8 input phases. Each input phase (after the first input phase) having a phase offset of π/4 from the previous input phase. The frequency of the input phases is predefined, where 2π represents the phase change over one period of the waveform Phase 0.

The cnt_0 waveform generated by the 1-bit counter in FIG. 8 experiences a rising edge only upon a rising edge of the clock input to the 1-bit counter, which is Phase 0 of the input waveform set of FIG. 10. Therefore the UP-TIME, that is, the duration for which the cnt_0 is at Logical 1, is same as the period of Phase 0 of the input waveform set. However cnt_0 does not rise again until a total of K=2 clock periods have passed. The same statements hold for cnt_1, which is offset from cnt_0 by one clock period.

In as much as a D flip-flop follows at its output its input that was present prior to the rising edge of its clock, the output of flip-flop labeled '0' of FIG. 8 will be the same as the cnt_0 signal, except delayed by a period equal to the period of the Phase 0 waveform of the input waveform 1005. Here, no delay is present and the output of flip-flop labeled '0' will immediately follow the cnt_0 signal. Therefore, we get the Phase 0 waveform of the output waveform 1010 of FIG. 10.

Similarly, the output of flip-flop labeled '1' of FIG. 8 will be the same as the output of flip-flop labeled '0' of FIG. 8, except delayed with reference to Phase 0 of the output by an amount equal to the phase difference between Input Phase 0 and Input Phase 2. Thus we realize the desired objective of having the phase difference between Output Phase 0 and Output Phase 1 to be twice the difference between Input Phase 0 and Input Phase 1. Subsequently, the output of flip-flop labeled '2' of FIG. 8 will be the same as the output of flip-flop labeled '0' of FIG. 8, except delayed with reference to Phase 0 of the output by an amount equal to the phase difference between Input Phase 0 and Input Phase 4. This results in the phase difference between Output Phase 0 and Output Phase 2 to be twice the difference between Input Phase 0 and Input Phase 2. Further, the output of flip-flop labeled '3' of FIG. 8 will be the same as the output of flip-flop labeled '0' of FIG. 8, except delayed with reference to Phase 0 of the output by an amount equal to the phase difference between Input Phase 0 and Input Phase 6. This results in the phase difference between Output Phase 0 and Output Phase 3 to be twice the difference between Input Phase 0 and Input Phase 3.

At the instant when Input Phase 0 (1005) rises for the second time, cnt_0 goes to logic '0' and cnt_1 goes high. The D input of flip-flop labeled '4' follows at its output its input that was present prior to the rising edge of its clock, i.e. cnt_1. The output of flip-flop labeled '4' of FIG. 8 will therefore be the same as the cnt_1 signal, except delayed by a period equal to the period of the Phase 0 waveform of the input waveform 1005, i.e. one clock period. That is, Output Phase 4 (1010) rises at the instants of the second and every other rising edge of Input Phase 0 (1005). Therefore, we get the Phase 4 waveform of the output waveform 1010 of FIG. 10 and realize the desired objective of the phase difference between Output Phase 4 (1010) and Output Phase 0 (1010) being twice that of the phase difference between Input Phase 4 (1005) and Input Phase 0 (1005).

Similarly, the output of flip-flop labeled '5' of FIG. 8 will be the same as the output of flip-flop labeled '4' of FIG. 8, except delayed with reference to Phase 0 of the output by an amount equal to the phase difference between the first rising edge of Input Phase 0 and the second rising edge of the Input Phase 2. Thus we realize the desired objective of having the phase difference between Output Phase 0 and Output Phase 5 to be twice the difference between Input Phase 0 and Input Phase 5. Subsequently, the output of flip-flop labeled '6' of FIG. 8 will be the same as the output of flip-flop labeled '4' of FIG. 8, except delayed with reference to Phase 0 of the output by an amount equal to the phase difference between the first rising edge of the Input Phase 0 and second rising edge of Input Phase 4. This results in the phase difference between Output Phase 0 and Output Phase 6 to be twice the difference between Input Phase 0 and Input Phase 6. Further, the output of flip-flop labeled '7' of FIG. 8 will be the same as the output of flip-flop labeled '4' of FIG. 8, except delayed with reference to Phase 0 of the output by an amount equal to the phase difference between first rising edge of the Input Phase 0 and the second rising edge of the Input Phase 6. This results in the phase difference between Output Phase 0 and Output Phase 7 to be twice the difference between Input Phase 0 and Input Phase 7.

Similarly, the output waveforms 1010 are generated with respect to the input waveforms 1005 for subsequent cnt_0 and cnt_1 states.

After the divide by 2 operation described in FIG. 8, the 8 output phases are generated by the clock divider circuit 800. It is to be noted that the frequency of the output phases is halved as compared to the input phases. Further, the phase difference between two output phases is twice that of the corresponding input phases.

Figure 11:
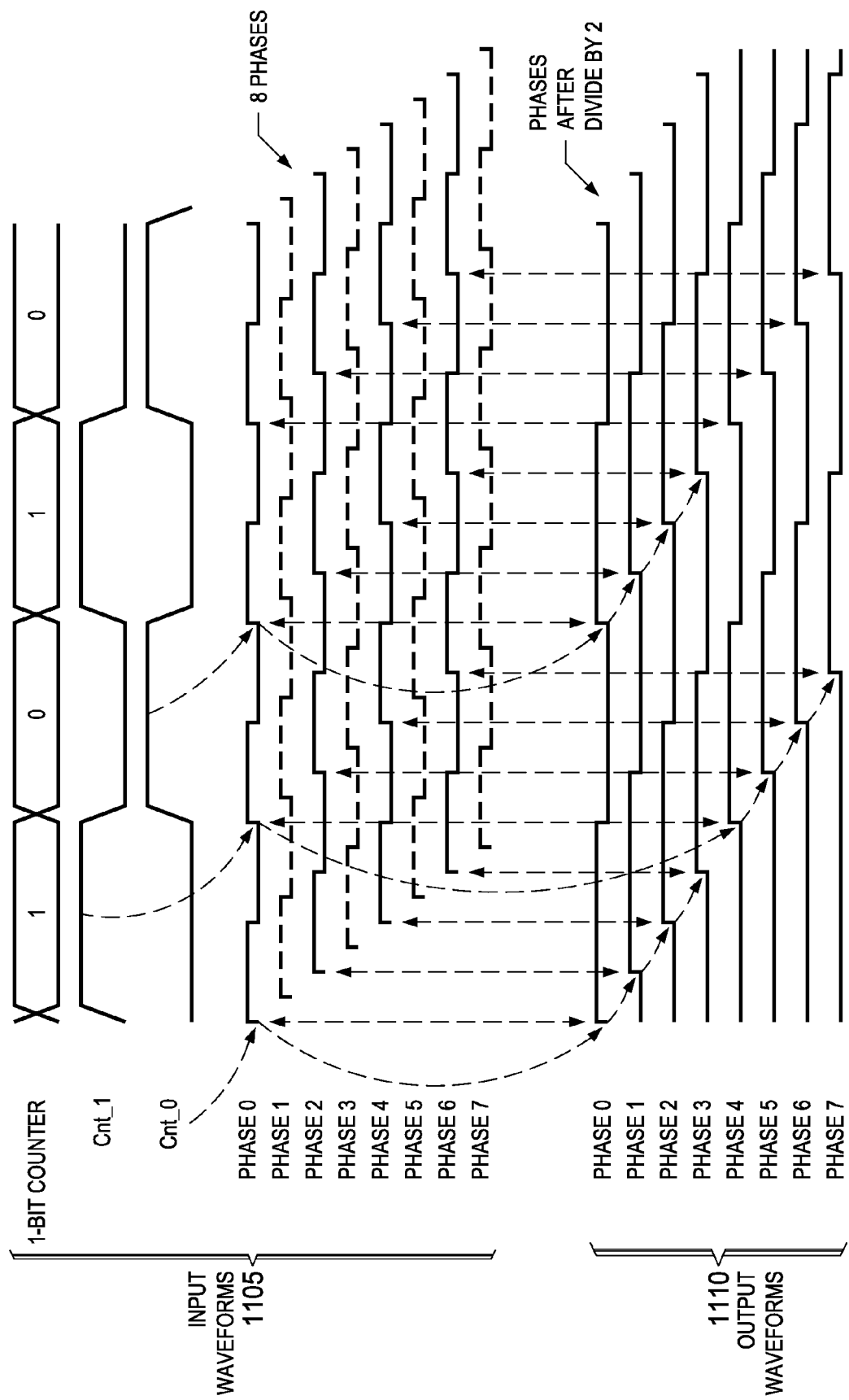
FIG. 11 is another illustration of a divide-by-two operation on 8 clock signals all of the same frequency, each signal after the first being phase-shifted from the phase of the previous one by 1/8 of a period.

FIG. 11 is another illustration of a divide-by 2 m-equidistant phase clock signals for the clock divider circuit 900.

The upper half of the FIG. 11 represents input waveforms 1105 to divide by 2 clock divider circuits, and the lower half represents output waveforms 1110 from the divide by 2 clock divider circuits. The input waveforms 1105 include signal generated from a 1-bit counter, signals corresponding to individual states of the 1-bit counter (cnt_0 and cnt_1) and 8 input phases. Each input phase (after the first input phase) having a phase offset of $\pi/4$ from the previous input phase. The frequency of the input phases is predefined, where $2\pi$ represents the phase change over one period of the waveform Phase 0.

The cnt_0 waveform generated by the 1-bit counter in FIG. 9 experiences a rising edge only upon a rising edge of the clock input to the 1-bit counter, which is Phase 0 of the input waveform set of FIG. 11. Therefore the UP-TIME, that is, the duration for which the cnt_0 is at Logical 1, is same as the period of Phase 0 of the input waveform set. However cnt_0 does not rise again until a total of K=2 clock periods have passed. The same statements hold for cnt_1, which is offset from cnt_0 by one clock period.

In as much as a D flip-flop follows at its output its input that was present prior to the rising edge of its clock, the output of flip-flop labeled '0' of FIG. 9 will be the same as the cnt_0 signal, except delayed by a period equal to the period of the Phase 0 waveform of the input waveform 1105. Here, no delay is present and the output of flip-flop labeled '0' will immediately follow the cnt_0 signal. Therefore, we get the Phase 0 waveform of the output waveform 1110 of FIG. 11.

Similarly, the output of flip-flop labeled '1' of FIG. 9 will be the same as the output of flip-flop labeled '0' of FIG. 9, except delayed with reference to Phase 0 of the output by an amount equal to the phase difference between Input Phase 0 and Input Phase 2. Thus we realize the desired objective of having the phase difference between Output Phase 0 and Output Phase 1 to be twice the difference between Input Phase 0 and Input Phase 1. Subsequently, the output of flip-flop labeled '2' of FIG. 9 will be the same as the output of flip-flop labeled '1' of FIG. 9, except delayed with reference to Phase 0 of the output by an amount equal to the phase difference between Input Phase 0 and Input Phase 4. This results in the phase difference between Output Phase 0 and Output Phase 2 to be twice the difference between Input Phase 0 and Input Phase 2. Further, the output of flip-flop labeled '3' of FIG. 9 will be the same as the output of flip-flop labeled '2' of FIG. 9, except delayed with reference to Phase 0 of the output by an amount equal to the phase difference between Input Phase 0 and Input Phase 6. This results in the phase difference between Output Phase 0 and Output Phase 3 to be twice the difference between Input Phase 0 and Input Phase 3.

At the instant when Input Phase 0 (1105) rises for the second time, cnt_0 goes to logic '0' and cnt_1 goes high. The D input of flip-flop labeled '4' follows at its output its input that was present prior to the rising edge of its clock, i.e. cnt_1. The output of flip-flop labeled '4' of FIG. 9 will therefore be the same as the cnt_1 signal, except delayed by a period equal to the period of the Phase 0 waveform of the input waveform 1105, i.e. one clock period. That is, Output Phase 4 (1110) rises at the instants of the second and every other rising edge of Input Phase 0 (1105). Therefore, we get the Phase 4 waveform of the output waveform 1110 of FIG. 11 and realize the desired objective of the phase difference between Output Phase 4 (1110) and Output Phase 0 (1110) being twice that of the phase difference between Input Phase 4 (1105) and Input Phase 0 (1105).

Similarly, the output of flip-flop labeled '5' of FIG. 9 will be the same as the output of flip-flop labeled '4' of FIG. 9, except delayed with reference to Phase 0 of the output by an amount equal to the phase difference between the first rising edge of Input Phase 0 and the second rising edge of the Input Phase 2. Thus we realize the desired objective of having the phase difference between Output Phase 0 and Output Phase 5 to be twice the difference between Input Phase 0 and Input Phase 5. Subsequently, the output of flip-flop labeled '6' of FIG. 9 will be the same as the output of flip-flop labeled '5' of FIG. 9, except delayed with reference to Phase 0 of the output by an amount equal to the phase difference between the first rising edge of the Input Phase 0 and second rising edge of Input Phase 4. This results in the phase difference between Output Phase 0 and Output Phase 6 to be twice the difference between Input Phase 0 and Input Phase 6. Further, the output of flip-flop labeled '7' of FIG. 9 will be the same as the output of flip-flop labeled '6' of FIG. 9, except delayed with reference to Phase 0 of the output by an amount equal to the phase difference between first rising edge of the Input Phase 0 and the second rising edge of the Input Phase 6. This results in the phase difference between Output Phase 0 and Output Phase 7 to be twice the difference between Input Phase 0 and Input Phase 7.

Similarly, the output waveforms 1110 are generated with respect to the input waveforms 1105 for subsequent cnt_0 and cnt_1 states.

After the divide by 2 operation described in FIG. 9, the 8 output phases are generated by the clock divider circuit 900. It is to be noted that the frequency of the output phases is halved as compared to the input phases. Further, the phase difference between two output phases is twice that of the corresponding input phases.

Figure 12:
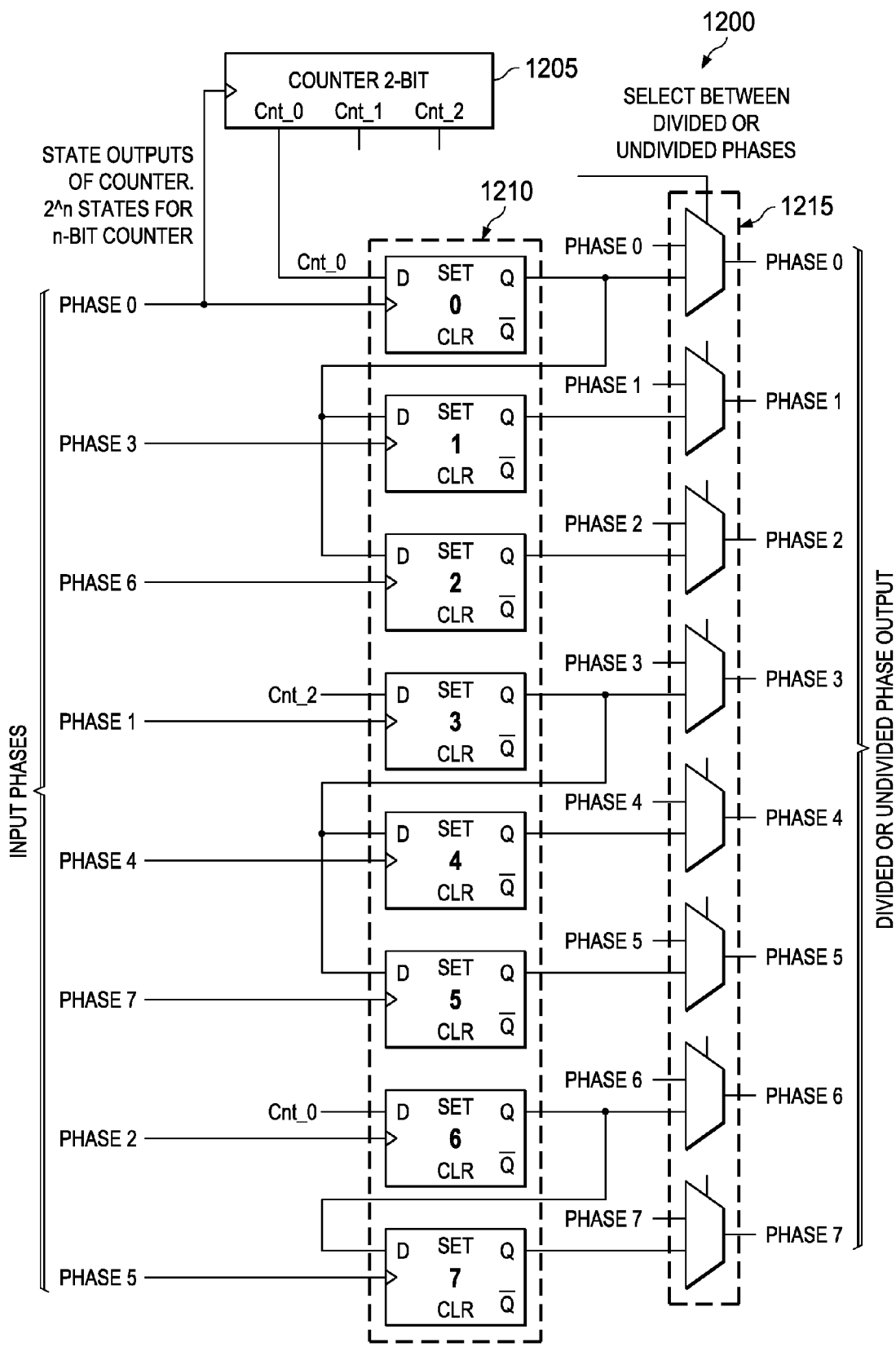
FIG. 12 is a block diagram of a divide-by-three clock divider circuit, in accordance with one embodiment.

As in FIG. 12, a clock divider circuit 1200 for performing a divide by 3 operation is shown. The clock divider circuit 1200 includes a counter 1205, a group of flip-flops 1210 and a corresponding set of 2:1 multiplexers 1215.

The number of input phases is given as m=8 and the division factor K=3. The 8 input and output phases are identified as (Ph0, Ph1, Ph2 . . . Ph7). The counter 1205 is a 2-bit counter with states cnt_0, cnt_1 and cnt_2 since c=[ceil (log$_2$K)]=2 bit. For 8 input phases, the group of flip-flops 1210 include 8 flip-flops labeled as FF{0, 1, 2 . . . 7}.

The clock inputs to each flip-flop is determined using [(K* (FF_label) MOD m)], where FF_label refers to the label of each flip-flop, for example a first flip-flop in the figure has a label '0'. Thereby, the input phases to successive flip-flops among the group of flip-flops 1210 are given as (Ph0, Ph3, Ph6, Ph1, Ph4, Ph7, Ph2, Ph5). Using such a sequence, the phase difference of the output phases at Q output of each flip-flop is multiplied by a factor of 3. Further, the counter 1205 is clocked by the first input phase, i.e. Ph0.

One of the states of the counter 1205 is latched to one or more flip-flops of the set of flip-flops 1210. Input to be latched to each flip-flop is determined by grouping one or flip-flops in sets and associating the state to each sets. The number of sets is equal to [min(K, m)=3]. The maximum number of flip-flops associated with a single set is determined as p=(Ceil(m/K))=3. Further, each set includes flip-flops that have consecutive labels. In the illustration of FIG. 12, the sets are classified as S1={0,1,2}, S2={3,4,5} and S3={6,7}, where {0,1,2,3,4,5,6, 7} refers to the labels of the flip-flops. The state to be latched to each set is determined using z=(ceil(nK/m)) mod K, where z refers to the count state, n refers to the first label in each set.

Figure 13:
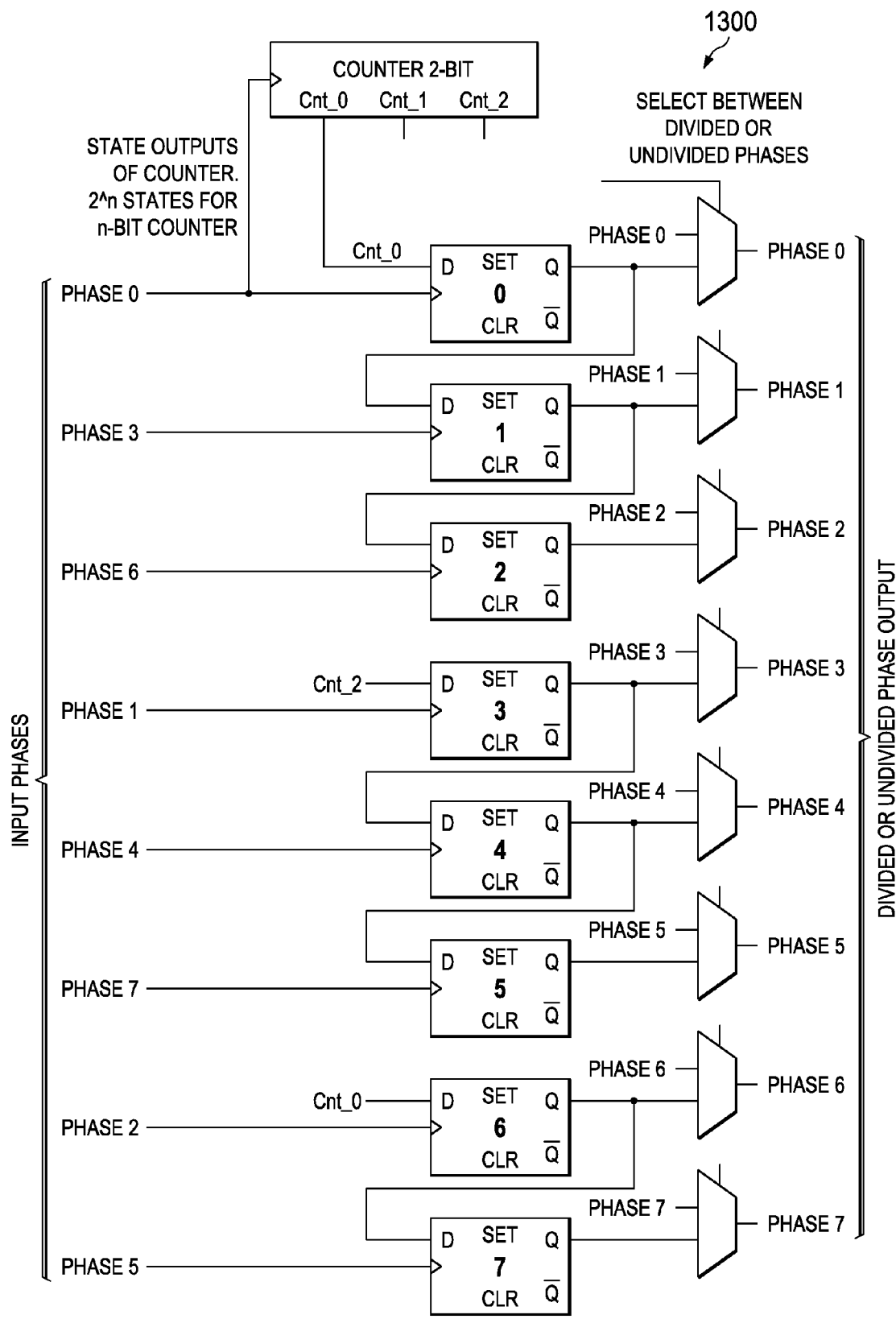
FIG. 13 is a block diagram of a divide-by-three clock divider circuit in accordance with another embodiment.

For set S1, the counter state is determined as cnt_0. For set S2, the counter state is determined as cnt_2. For set S3, the count state is determined as cnt_0. For the selected combination of sets, cnt_1 is not used. Consecutively for set S1, D input of the first flip-flop labeled {0} is latched to a first state of cnt_0. Further, the D inputs of the remaining flip-flops classified in the Set S1 latches to a Q output of the first flip-flop labeled {0}. In some embodiments, the D inputs of the remaining flip-flops classified in the Set S1 latches to Q outputs of the previous flip-flop in the Set S1 (as shown in FIG. 13). Similarly, for set S2, D input of the flip-flop labeled {3} is latched to the cnt_2. Further, the D inputs of the remaining flip-flops classified in the Set S2 latches to a Q output of the flip-flop labeled {3}. In some embodiments, the D inputs of the remaining flip-flops classified in the Set S2 latches to Q outputs of the previous flip-flop in the Set S2 (as shown in FIG. 13). Further, for set S3, D input of the flip-flop labeled {6} is latched to second state of the cnt_0. The D inputs of the remaining flip-flop classified in the Set S3 latches to a Q output of the flip-flop labeled {6}. Utilizing the counter states as D-input as mentioned herein results in the clock period of output phases multiplied by a factor 3.

The flip-flops labeled {0,1,2,3,4,5,6,7} output a divided output phases {Ph0, Ph1, Ph2, Ph3, Ph4, Ph 5, Ph6, Ph7} respectively. The clock period of the output phases are multiplied by the factor 3.

In an embodiment, the clock divider circuit 1200 can be operable to perform selection of divided or undivided phases (input phases) using the set of 2:1 multiplexers 1215. Each divided output phase is input to a first input of a 2:1 multiplexer individually by coupling the Q output of the flip-flops to the first input of the set of 2:1 multiplexers 1215. A second input of the set of 2:1 multiplexers 1215 receives the undivided phases (input phases) as input. A select line to the multiplexer can be used in selecting either of the first input or the second input.

The clock divider circuit 1300 of FIG. 13 illustrates a divide by 3 operation, in accordance with another embodiment. The operation of the clock divider circuit 1300 is similar to the clock divider circuit 1200 in FIG. 12. However, during selection of counter states for each set, D input of the first flip-flop in the state is latched to a respective count. For example, flip-flop labeled {0} of set S1 is latched to cnt_0, the flip-flop labeled {3} of set S2 is latched to cnt_2 and the flip-flop labeled {6} of set S3 is latched to cnt_0. The D inputs of the remaining flip-flops classified in a set latches to Q outputs of the previous flip-flop in that set.

Figure 14:
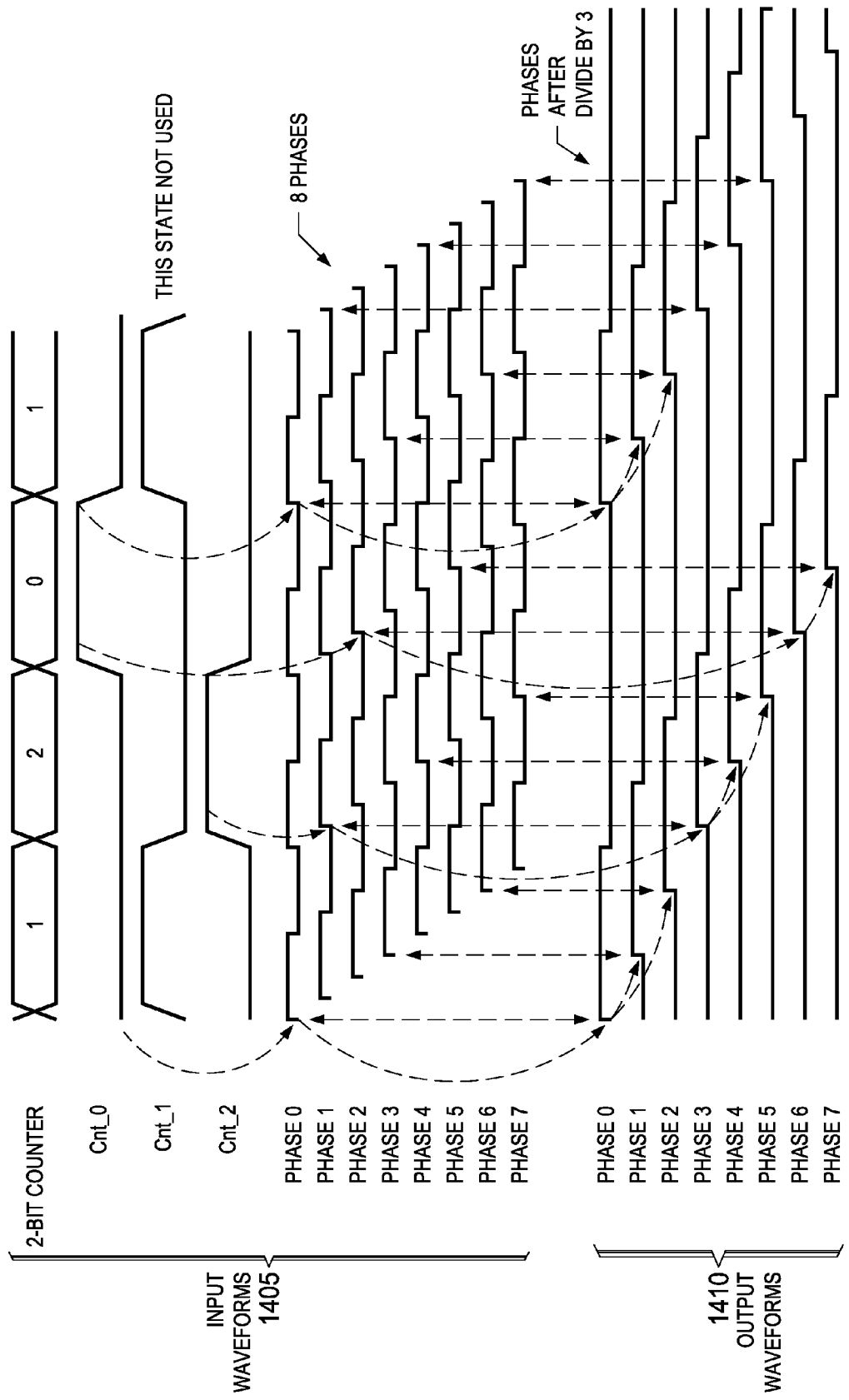
FIG. 14 is an illustration of a divide-by-three operation on 8 clock signals all of the same frequency, each signal after the first being phase-shifted from the phase of the previous one by 1/8 of a period.

FIG. 14 is an illustration of a divide-by 3 m-equidistant phase clock signals for the clock divider circuit 1200.

The upper half of the FIG. 14 represents input waveforms 1405 to divide by 3 clock divider circuits, and the lower half represents output waveforms 1410 from the divide by 3 clock divider circuits. The input waveforms 1405 include signal generated from a 2-bit counter, signals corresponding to individual states of the 2-bit counter (cnt_0, cnt_1 and cnt_2) and 8 input phases. Each input phase (after the first input phase) having a phase offset of $\pi/4$ from the previous input phase. The frequency of the input phases is predefined, where $2\pi$ represents the phase change over one period of the waveform Phase 0.

The cnt_0 waveform generated by the 2-bit counter in FIG. 12 experiences a rising edge only upon a rising edge of the clock input to the 2-bit counter, which is Phase 0 of the input waveform set of FIG. 14. Therefore the UP-TIME, that is, the duration for which the cnt_0 is at Logical 1, is same as the period of Phase 0 of the input waveform set. However cnt_0 does not rise again until a total of K=3 clock periods have passed. The same statements hold for cnt_1 and cnt_2, which is offset from cnt_0 by one clock period and two clock periods respectively.

In as much as a D flip-flop follows at its output its input that was present prior to the rising edge of its clock, the output of flip-flop labeled '0' of FIG. 12 will be the same as the cnt_0 signal, except delayed by a period equal to the period of the Phase 0 waveform of the input waveform 1405. Here, no delay is present and the output of flip-flop labeled '0' will immediately follow the cnt_0 signal. Therefore, we get the Phase 0 waveform of the output waveform 1410 of FIG. 14. The output of flip-flop labeled '1' of FIG. 12 will be the same as the output of flip-flop labeled '0' of FIG. 12, except delayed with reference to Phase 0 of the output by an amount equal to the phase difference between Input Phase 0 and Input Phase 3. Thus we realize the desired objective of having the phase difference between Output Phase 0 and Output Phase 1 to be thrice the difference between Input Phase 0 and Input Phase 1. Subsequently, the output of flip-flop labeled '2' of FIG. 12 will be the same as the output of flip-flop labeled '0' of FIG. 12, except delayed with reference to Phase 0 of the output by an amount equal to the phase difference between Input Phase 0 and Input Phase 6. This results in the phase difference between Output Phase 0 and Output Phase 2 to be thrice the difference between Input Phase 0 and Input Phase 2. During this stage, the cnt_1 goes high, but is unutilized by the clock divider circuit 1200.

At the instant of cnt_2 going to logic 1, the cnt_1 goes to logic 0. The D input of flip-flop labeled '3' follows at its output its input that was present prior to the rising edge of its clock, i.e. cnt_2. The output of flip-flop labeled '3' of FIG. 12 will be the same as the cnt_2 signal, except delayed by a period equal to the period of the Phase 1 waveform of the input waveform 1405, i.e. at the instant of the second rising edge of the Phase 1 waveform of the input waveform 1405. Therefore, we get the Phase 3 waveform of the output waveform 1410 of FIG. 14. The output of flip-flop labeled '4' of FIG. 12 will be the same as the output of flip-flop labeled '3' of FIG. 12, except delayed with reference to Phase 0 of the output by an amount equal to the phase difference between Input Phase 0 and second rising edge of Input Phase 4. Thus we realize the desired objective of having the phase difference between Output Phase 0 and Output Phase 4 to be thrice the difference between Input Phase 0 and Input Phase 4. Subsequently, the output of flip-flop labeled '5' of FIG. 12 will be the same as the output of flip-flop labeled '3' of FIG. 12, except delayed with reference to Phase 0 of the output by an amount equal to the phase difference between Input Phase 0 and second rising edge of the Input Phase 7. This results in the phase difference between Output Phase 0 and Output Phase 5 to be thrice the difference between Input Phase 0 and Input Phase 5.

At this instant of cnt_2 going to logic 0, and the cnt_0 goes to logic 1. The cnt_1 is at logic 0. The D input of flip-flop labeled '6' follows at its output its input that was present prior to the rising edge of its clock, i.e. cnt_0. The output of flip-flop labeled '6' of FIG. 12 will be the same as the cnt_0 signal, except delayed by a period equal to the period of the Phase 2 waveform of the input waveform 1405, i.e. at the instant of the third rising edge of the Phase 2 waveform of the input waveform 1405. Therefore, we get the Phase 6 waveform of the output waveform 1410 of FIG. 14. The output of flip-flop labeled '7' of FIG. 12 will be the same as the output of flip-flop labeled '6' of FIG. 12, except delayed with reference to Phase 0 of the output by an amount equal to the phase difference between Input Phase 0 and third rising edge of Input Phase 5. Thus we realize the desired objective of having the phase difference between Output Phase 0 and Output Phase 7 to be thrice the difference between Input Phase 0 and Input Phase 7.

Similarly, the output waveforms 1410 are generated with respect to the input waveforms 1405 for subsequent cnt_0, cnt_2 states.

After the divide by 3 operation described in FIG. 12, the 8 output phases are generated by the clock divider circuit 1200. It is to be noted that the frequency of the output phases is divided by three as compared to the input phases. Further, the phase difference between two output phases is thrice that of the corresponding input phases.

Figure 15:
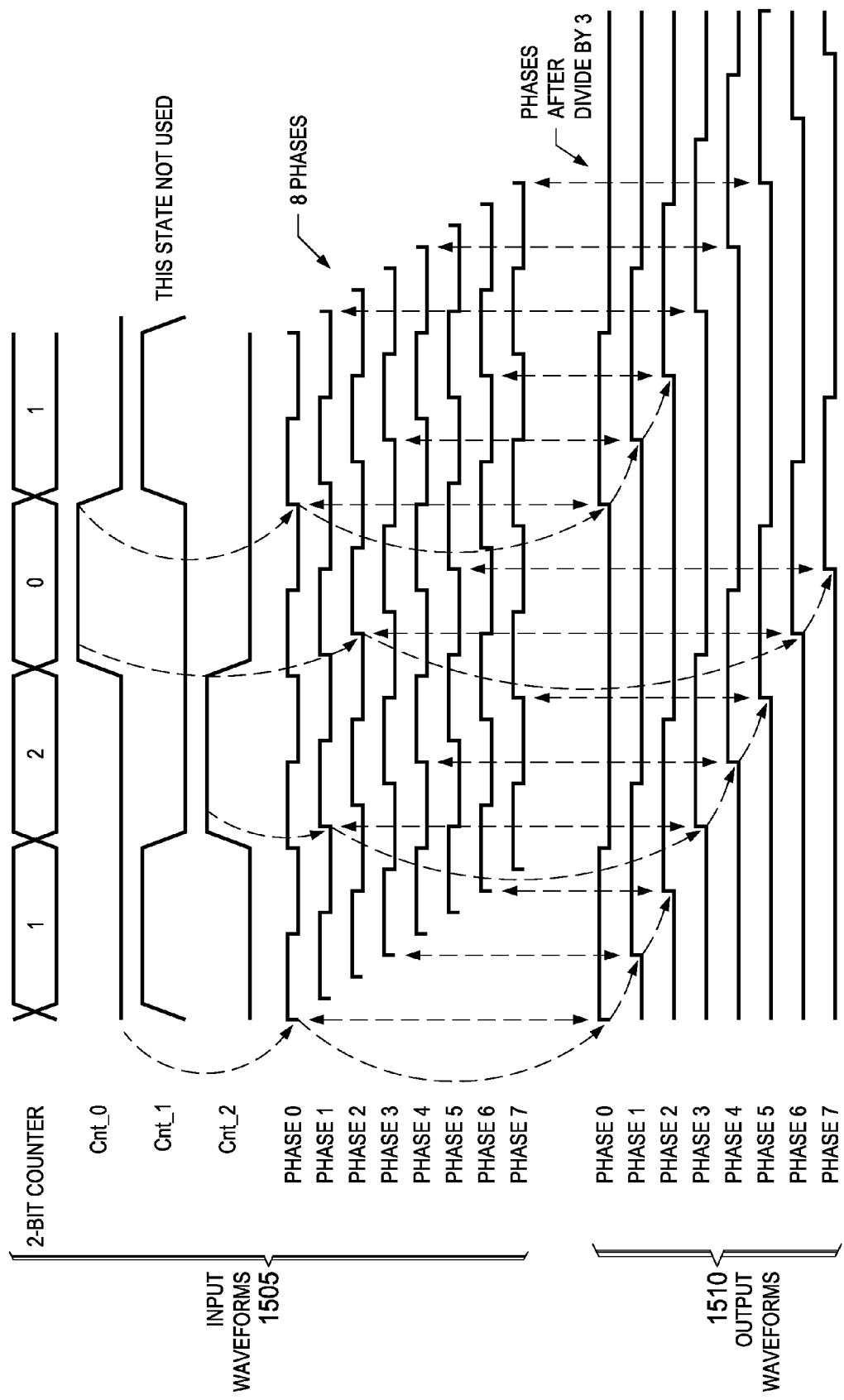
FIG. 15 is another illustration of a divide-by-three operation on 8 clock signals all of the same frequency, each signal after the first being phase-shifted from the phase of the previous one by 1/8 of a period.

FIG. 15 is an illustration of a divide-by 3 m-equidistant phase clock signals for the clock divider circuit 1300.

The upper half of the FIG. 15 represents input waveforms 1505 to divide by 3 clock divider circuits, and the lower half represents output waveforms 1510 from the divide by 3 clock divider circuits. The input waveforms 1505 include signal generated from a 2-bit counter, signals corresponding to individual states of the 2-bit counter (cnt_0, cnt_1 and cnt_2) and 8 input phases. Each input phase (after the first input phase) having a phase offset of $\pi/4$ from the previous input phase. The frequency of the input phases is predefined, where $2\pi$ represents the phase change over one period of the waveform Phase 0.

The cnt_0 waveform generated by the 2-bit counter in FIG. 13 experiences a rising edge only upon a rising edge of the clock input to the 2-bit counter, which is Phase 0 of the input waveform set of FIG. 15. Therefore the UP-TIME, that is, the duration for which the cnt_0 is at Logical 1, is same as the period of Phase 0 of the input waveform set. However cnt_0 does not rise again until a total of K=3 clock periods have passed. The same statements hold for cnt_1 and cnt_2, which is offset from cnt_0 by one clock period and two clock periods respectively.

In as much as a D flip-flop follows at its output its input that was present prior to the rising edge of its clock, the output of flip-flop labeled '0' of FIG. 13 will be the same as the cnt_0 signal, except delayed by a period equal to the period of the Phase 0 waveform of the input waveform 1505. Here, no delay is present and the output of flip-flop labeled '0' will immediately follow the cnt_0 signal. Therefore, we get the Phase 0 waveform of the output waveform 1510 of FIG. 15. The output of flip-flop labeled '1' of FIG. 13 will be the same as the output of flip-flop labeled '0' of FIG. 13, except delayed with reference to Phase 0 of the output by an amount equal to the phase difference between Input Phase 0 and Input Phase 3. Thus we realize the desired objective of having the phase difference between Output Phase 0 and Output Phase 1 to be thrice the difference between Input Phase 0 and Input Phase 1. Subsequently, the output of flip-flop labeled '2' of FIG. 13 will be the same as the output of flip-flop labeled '1' of FIG. 13, except delayed with reference to Phase 0 of the output by an amount equal to the phase difference between Input Phase 0 and Input Phase 6. This results in the phase difference between Output Phase 0 and Output Phase 2 to be thrice the difference between Input Phase 0 and Input Phase 2. During this stage, the cnt_1 goes high, but is unutilized by the clock divider circuit 1300.

At the instant of cnt_2 going to logic 1, the cnt_1 goes to logic 0. The D input of flip-flop labeled '3' follows at its output its input that was present prior to the rising edge of its clock, i.e. cnt_2. The output of flip-flop labeled '3' of FIG. 13 will be the same as the cnt_2 signal, except delayed by a period equal to the period of the Phase 1 waveform of the input waveform 1505, i.e. at the instant of the second rising edge of the Phase 1 waveform of the input waveform 1505. Therefore, we get the Phase 3 waveform of the output waveform 1510 of FIG. 15. The output of flip-flop labeled '4' of FIG. 13 will be the same as the output of flip-flop labeled '3' of FIG. 13, except delayed with reference to Phase 0 of the output by an amount equal to the phase difference between Input Phase 0 and second rising edge of Input Phase 4. Thus we realize the desired objective of having the phase difference between Output Phase 0 and Output Phase 4 to be thrice the difference between Input Phase 0 and Input Phase 4. Subsequently, the output of flip-flop labeled '5' of FIG. 13 will be the same as the output of flip-flop labeled '4' of FIG. 13, except delayed with reference to Phase 0 of the output by an amount equal to the phase difference between Input Phase 0 and second rising edge of the Input Phase 7. This results in the phase difference between Output Phase 0 and Output Phase 5 to be thrice the difference between Input Phase 0 and Input Phase 5.

At this instant of cnt_2 going to logic 0, and the cnt_0 goes to logic 1. The cnt_1 is at logic 0. The D input of flip-flop labeled '6' follows at its output its input that was present prior to the rising edge of its clock, i.e. cnt_0. The output of flip-flop labeled '6' of FIG. 13 will be the same as the cnt_0 signal, except delayed by a period equal to the period of the Phase 2 waveform of the input waveform 1505, i.e. at the instant of the third rising edge of the Phase 2 waveform of the input waveform 1505. Therefore, we get the Phase 6 waveform of the output waveform 1510 of FIG. 15. The output of flip-flop labeled '7' of FIG. 13 will be the same as the output of flip-flop labeled '6' of FIG. 13, except delayed with reference to Phase 0 of the output by an amount equal to the phase difference between Input Phase 0 and third rising edge of Input Phase 5. Thus we realize the desired objective of having the phase difference between Output Phase 0 and Output Phase 7 to be thrice the difference between Input Phase 0 and Input Phase 7.

Similarly, the output waveforms 1510 are generated with respect to the input waveforms 1505 for subsequent cnt_0, cnt_2 states.

After the divide by 3 operation described in FIG. 13, the 8 output phases are generated by the clock divider circuit 1300. It is to be noted that the frequency of the output phases is divided by three as compared to the input phases. Further, the phase difference between two output phases is thrice that of the corresponding input phases.

Figure 16:
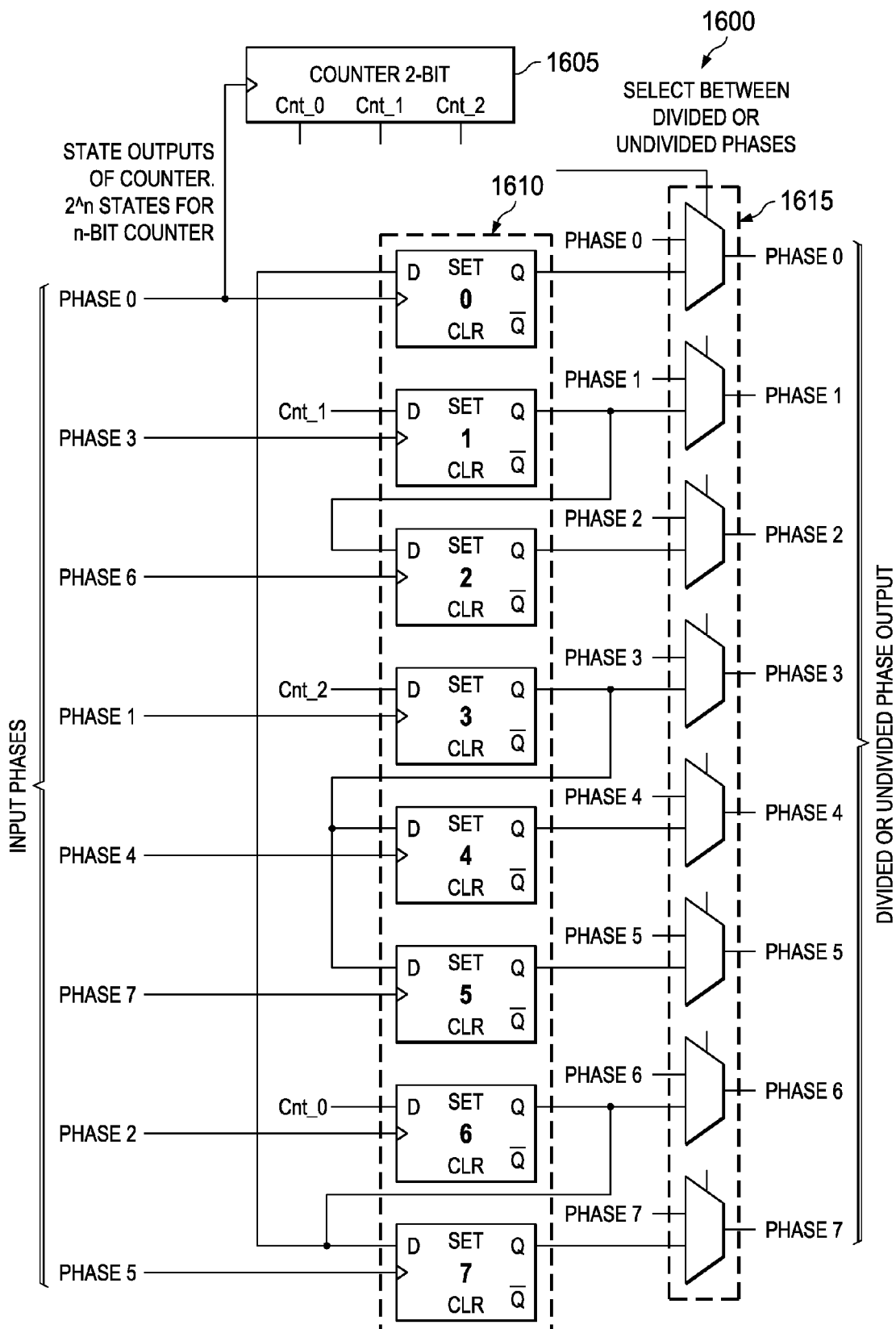
FIG. 16 is a block diagram of another divide-by-three clock divider circuit, in accordance with one embodiment.

As in FIG. 16, a clock divider circuit 1600 for performing a divide by 3 operation is shown. The clock divider circuit 1600 includes a counter 1605, a group of flip-flops 1610 and a corresponding set of 2:1 multiplexers 1615. It is to be noted that the method of the divide by 3 operation by the clock divider circuit 1600 is same as the method of the divide by 3 operation by the clock divide circuit 1200 in FIG. 12. However, the sets are classified as S1={1,2}, S2={3, 4,5} and S3={6,7,0}, where {0,1,2,3,4,5,6,7} refers to the labels of the flip-flops. The state to be latched to each set is determined using z=(ceil(nK/m)) mod K, where z refers to the count state, n refers to the first label in each set.

For set S1, the counter state is determined as cnt_1. For set S2, the counter state is determined as cnt_2. For set S3, the count state is determined as cnt_0. Consecutively for set S1, D input of the flip-flop labeled {1} is latched to a cnt_1. Further, the D inputs of the remaining flip-flops classified in the Set S1 latches to a Q output of the flip-flop labeled {1}. Similarly, for set S2, D input of the flip-flop labeled {4} is latched to the cnt_2. Further, the D inputs of the remaining flip-flops classified in the Set S2 latches to a Q output of the flip-flop labeled {4}. Further, for set S3, D input of the flip-flop labeled {6} is latched to second state of the cnt_0. The D inputs of the remaining flip-flop classified in the Set S3 latches to a Q output of the flip-flop labeled {6}. Utilizing the counter states as D-input as mentioned herein results in the clock period of output phases multiplied by a factor 3.

Figure 17:
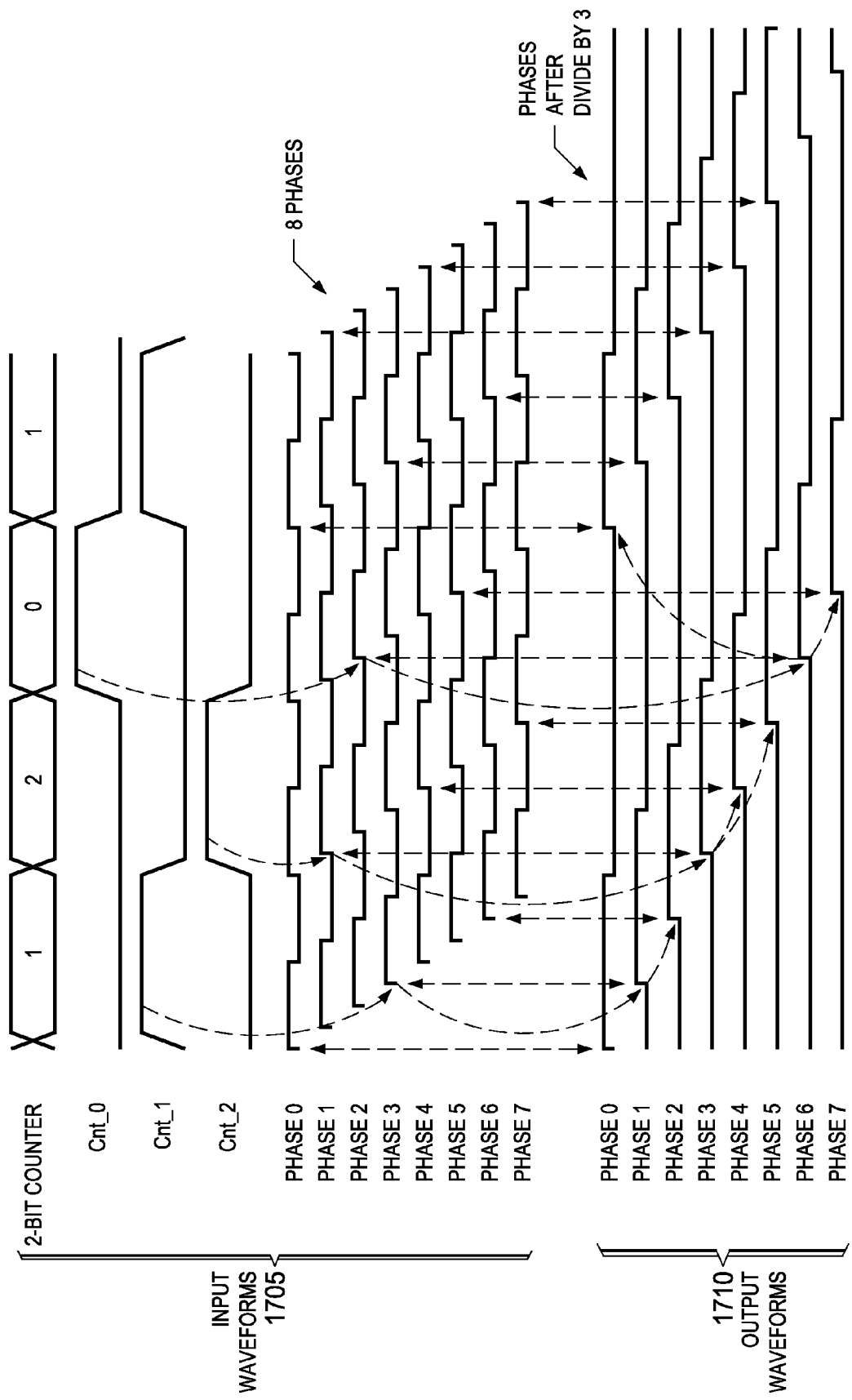
FIG. 17 is an illustration of another divide-by-three operation on 8 clock signals all of the same frequency, each signal after the first being phase-shifted from the phase of the previous one by 1/8 of a period.

FIG. 17 is an illustration of another divide-by 3 m-equidistant phase clock signals for the clock divider circuit 1600.

The upper half of the FIG. 17 represents input waveforms 1705 to divide by 3 clock divider circuits, and the lower half represents output waveforms 1710 from the divide by 3 clock divider circuits. The input waveforms 1705 include signal generated from a 2-bit counter, signals corresponding to individual states of the 2-bit counter (cnt_0, cnt_1 and cnt_2) and 8 input phases. Each input phase (after the first input phase) having a phase offset of $\pi/4$ from the previous input phase. The frequency of the input phases is predefined, where $2\pi$ represents the phase change over one period of the waveform Phase 0.

The cnt_0 waveform generated by the 2-bit counter in FIG. 16 experiences a rising edge only upon a rising edge of the clock input to the 2-bit counter, which is Phase 0 of the input waveform set of FIG. 16. Therefore the UP-TIME, that is, the duration for which the cnt_0 is at Logical 1, is same as the period of Phase 0 of the input waveform set. However cnt_0 does not rise again until a total of K=3 clock periods have passed. The same statements hold for cnt_1 and cnt_2, which is offset from cnt_0 by one clock period and two clock periods respectively.

Initially, as the cnt_0 goes from logic 1 to logic 0, the output of flip-flop labeled '0' of FIG. 16 will be the same as the output of flip-flop labeled '6' of FIG. 16, except delayed with reference to Phase 0.

At the instant of cnt_1 at logic '1'. In as much as a D flip-flop follows at its output its input that was present prior to the rising edge of its clock, the output of flip-flop labeled '1' of FIG. 16 will be the same as the cnt_1 signal, except delayed with reference to Phase 0 of the output by an amount equal to the phase difference between Input Phase 0 and Input Phase 3. Therefore, we get the Phase 1 waveform of the output waveform 1710 of FIG. 17. The output of flip-flop labeled '2' of FIG. 16 will be the same as the output of flip-flop labeled '1' of FIG. 16, except delayed with reference to Phase 0 of the output by an amount equal to the phase difference between Input Phase 0 and Input Phase 6. Thus we realize the desired objective of having the phase difference between Output Phase 0 and Output Phase 2 to be thrice the difference between Input Phase 0 and Input Phase 2.

At this instant, cnt_2 goes to logic 1 and the cnt_1 goes to logic 0. The cnt_0 is at logic 0. The D input of flip-flop labeled '3' follows at its output its input that was present prior to the rising edge of its clock, i.e. cnt_2. The output of flip-flop labeled '3' of FIG. 16 will be the same as the cnt_2 signal, except delayed by a period equal to the period of the Phase 1 waveform of the input waveform 1705, i.e. at the instant of the second rising edge of the Phase 1 waveform of the input waveform 1705. Therefore, we get the Phase 3 waveform of the output waveform 1710 of FIG. 17. The output of flip-flop labeled '4' of FIG. 16 will be the same as the output of flip-flop labeled '3' of FIG. 16, except delayed with reference to Phase 0 of the output by an amount equal to the phase difference between Input Phase 0 and second rising edge of Input Phase 4. Thus we realize the desired objective of having the phase difference between Output Phase 0 and Output Phase 4 to be thrice the difference between Input Phase 0 and Input Phase 4. Subsequently, the output of flip-flop labeled '5' of FIG. 16 will be the same as the output of flip-flop labeled '3' of FIG. 16, except delayed with reference to Phase 0 of the output by an amount equal to the phase difference between Input Phase 0 and second rising edge of the Input Phase 7. This results in the phase difference between Output Phase 0 and Output Phase 5 to be thrice the difference between Input Phase 0 and Input Phase 5.

At this instant, cnt_2 going to logic 0, and the cnt_0 goes to logic 1. The cnt_1 is at logic 0. The D input of flip-flop labeled '6' follows at its output its input that was present prior to the rising edge of its clock, i.e. cnt_0. The output of flip-flop labeled '6' of FIG. 16 will be the same as the cnt_0 signal, except delayed by a period equal to the period of the Phase 2 waveform of the input waveform 1705, i.e. at the instant of the third rising edge of the Phase 2 waveform of the input waveform 1705. Therefore, we get the Phase 6 waveform of the output waveform 1710 of FIG. 17. The output of flip-flop labeled '7' of FIG. 16 will be the same as the output of flip-flop labeled '6' of FIG. 16, except delayed with reference to Phase 0 of the output by an amount equal to the phase difference between Input Phase 0 and third rising edge of Input Phase 5. Thus we realize the desired objective of having the phase difference between Output Phase 0 and Output Phase 7 to be thrice the difference between Input Phase 0 and Input Phase 7.

Similarly, the output waveforms 1710 are generated with respect to the input waveforms 1705 for subsequent cnt_0, cnt_2 states.

After the divide by 3 operation described in FIG. 16, the 8 output phases are generated by the clock divider circuit 1600. It is to be noted that the frequency of the output phases is divided by three as compared to the input phases. Further, the phase difference between two output phases is thrice that of the corresponding input phases.

Figure 18:
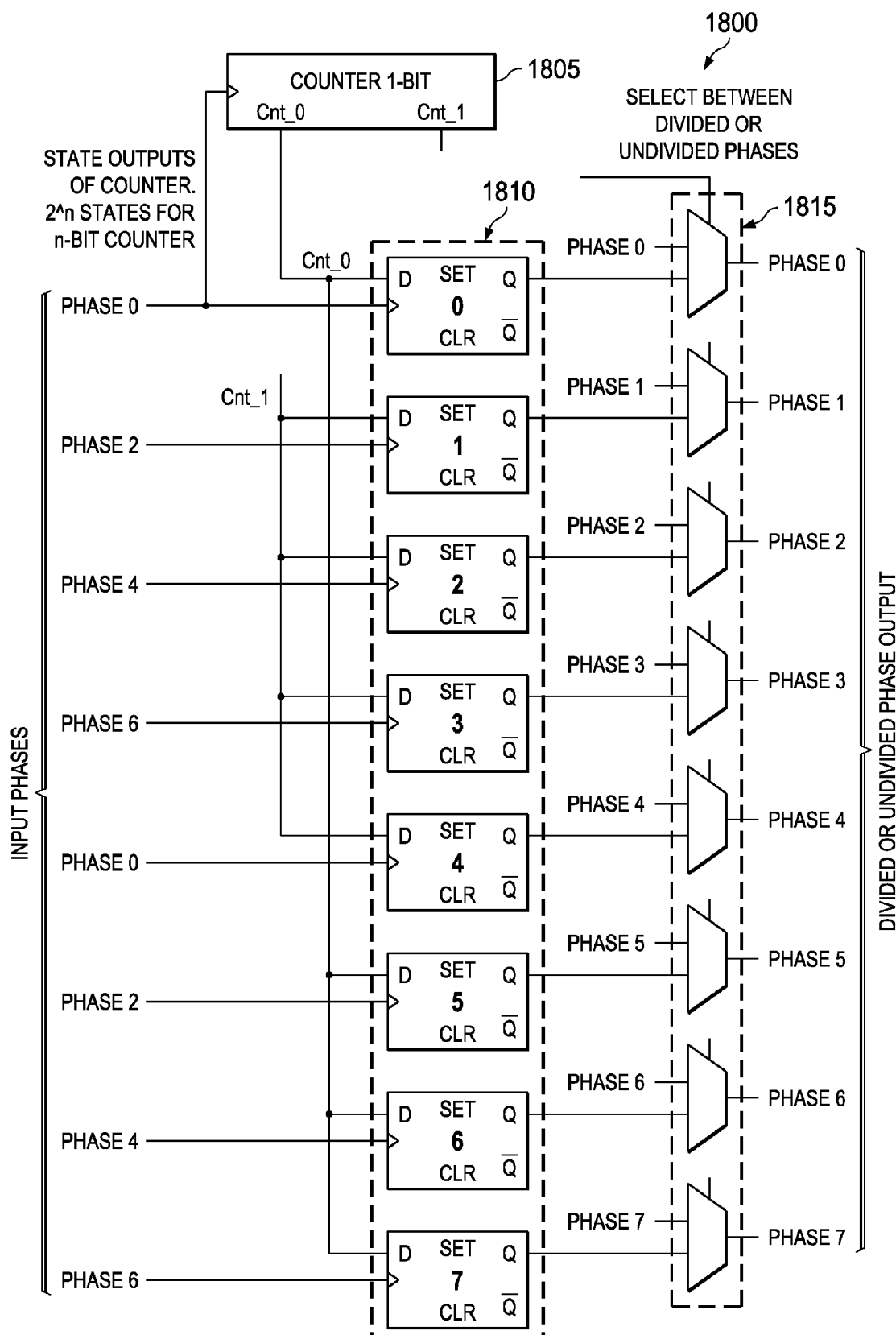
FIG. 18 is a block diagram of a divide-by-two clock divider circuit in accordance with another embodiment.

As in FIG. 18, a clock divider circuit 1800 for performing another divide by 2 operation is shown. The clock divider circuit 1800 includes a counter 1805, a group of flip-flops 1810 and a corresponding set of 2:1 multiplexers 1815.

The number of input phases is given as m=8 and the division factor K=2. The 8 input and output phases are identified as (Ph0, Ph1, Ph2 .... Ph7). The counter 1805 is a 1-bit counter with states cnt_0 and cnt_1 since c=ceil ($\log_2 K$)=1 bit. For 8 input phases, the group of flip-flops 1810 include 8 flip-flops labeled as FF{0, 1, 2 ... 7}.

The clock inputs to each flip-flop is determined using [(K*FF_label) MOD m], where FF_label refers to the label of each flip-flop, for example a first flip-flop in the figure has a label '0'. Thereby, the input phases to successive flip-flops among the group of flip-flops 1810 are given as (Ph0, Ph2, Ph4, Ph6, Ph0, Ph2, Ph4, Ph6). Using such a sequence results in the phase difference between the output phases at Q output of each flip-flop being multiplied by a factor of 2. Further, the counter 1805 is clocked by the first input phase, i.e Ph0.

One of the states of the counter 1805 is latched to each flip-flop of the set of flip-flops 1810. State to be latched to each flip-flop is determined by grouping one or flip-flops in sets and associating the state to each sets. The number of sets is equal to [min(K, m)=2]. The maximum number of flip-flops associated with a single set is determined as p=(Ceil(m/K))=4. Further, each set includes flip-flops that have consecutive labels.

For each flip-flop, a z-value is determined. The z-value=z= (ceil(nK/m)) mod K, where n is the label associated with the flip-flop. All output waveforms with the same z-value form a set.

Here, K=2 and phases m=8, the number of sets S=2. The sets being denoted as S={S1 and S2}.

| | Output Waveform Label (n) | | | | | | | |
|---|---|---|---|---|---|---|---|---|
| | 0 | 1 | 2 | 3 | 4 | 5 | 6 | 7 |
| z-value | 0 | 1 | 1 | 1 | 1 | 0 | 0 | 0 |

Thus in this case the sets are the sets are classified as S1={1,2,3,4} and S2={5,6,7,0}, where {0,1,2,3,4,5,6,7} refers to the labels of the flip-flops.

Having formed the sets of output phases, Method 2 now simply calls for driving the D-flip-flop with label n with its corresponding cnt_z waveform.

For set S1, the counter state is determined as cnt_1. For set S2, the counter state is determined as cnt_0. Consecutively, flip-flops associated with set S1 are latched to a second state or cnt_1. Similarly, flip-flops associated with the set S2 are latched to a first state or cnt_0. Utilizing the counter states as D-input as mentioned herein results in the clock period of output phases multiplied by a factor 2.

The flip-flops labeled {0,1,2,3,4,5,6,7} output a divided output phases {Ph0, Ph1, Ph2, Ph3, Ph4, Ph 5, Ph6, Ph7} respectively. The clock period of the output phases are multiplied by the factor 2.

In an embodiment, the clock divider circuit 1800 can be operable to perform selection of divided or undivided phases (input phases) using the set of 2:1 multiplexers 1815. Each divided output phase is input to a first input of a 2:1 multiplexer individually by coupling the Q output of the flip-flops to the first input of the set of 2:1 multiplexers 1815. A second input of the set of 2:1 multiplexers 1815 receives the undivided phases (input phases) as input. A select line to the multiplexer can be used in selecting either of the first input or the second input.

Figure 19:
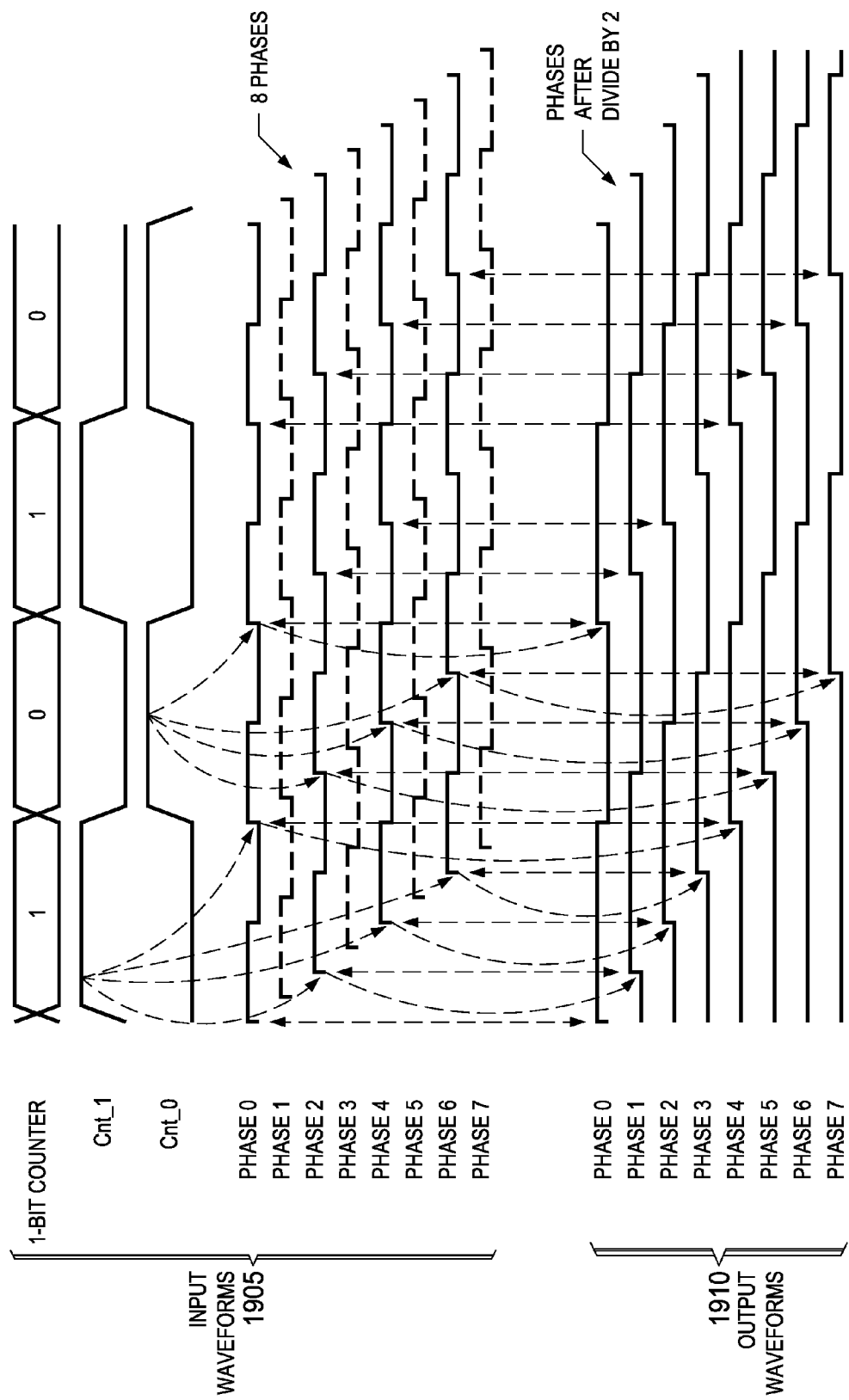
FIG. 19 is an illustration of a divide-by-two operation on 8 clock signals all of the same frequency, each signal after the first being phase-shifted from the phase of the previous one by 1/8 of a period.

FIG. 19 is an illustration of a divide-by 2 m-equidistant phase clock signals for the clock divider circuit 1800.

The upper half of the FIG. 19 represents input waveforms to divide by 2 clock divider circuits, and the lower half represents output waveforms from the divide by 2 clock divider circuits. The input waveforms include signal generated from a 1-bit counter, signals corresponding to individual states of the 1-bit counter (cnt_0 and cnt_1) and 8 input phases. Each input phase (after the first input phase) having a phase offset of $\pi/4$ from the previous input phase, where $2\pi$ represents the phase change over one period of the Phase 0 waveform of the Input Waveform Set. The frequency of the input phases is predefined.

The cnt_0 waveform generated by the 1-bit counter in FIG. 18 experiences a rising edge only upon a rising edge of the clock input to the 1-bit counter, which is Phase 0 of the input waveform set of FIG. 19. Therefore the UP-TIME, that is, the duration for which cnt_0 is at Logical 1, is same as the period of Phase 0 of the input waveform set. However cnt_0 does not rise again until a total of K=2 clock periods have passed. The same statements hold for cnt_1, which is offset from cnt_0 by one clock period.

The output of flip-flop labeled '0' of FIG. 18 will be the same as the cnt_0 signal, except delayed by a period equal to the period of the Phase 0 waveform of the input waveform 1905. Here, no delay is present and the output of flip-flop labeled '0' will immediately follow the cnt_0 signal. Therefore, we get the Phase 0 waveform of the output waveform 1910 of FIG. 19.

At this instant, cnt_1 goes to logic '1'. The output of flip-flop labeled '1' of FIG. 18 will be the same as the cnt_1 signal, except delayed with reference to Phase 0 of the output by an amount equal to the phase difference between Input Phase 0 and Input Phase 2. Thus we realize the desired objective of having the phase difference between Output Phase 0 and Output Phase 1 to be twice the difference between Input Phase 0 and Input Phase 1. Subsequently, the output of flip-flop labeled '2' of FIG. 18 will be the same as the cnt_1 signal, except delayed with reference to Phase 0 of the output by an amount equal to the phase difference between Input Phase 0 and Input Phase 4. This results in the phase difference between Output Phase 0 and Output Phase 2 to be twice the difference between Input Phase 0 and Input Phase 2. Further, the output of flip-flop labeled '3' of FIG. 18 will be the same as the cnt_1 signal, except delayed with reference to Phase 0 of the output by an amount equal to the phase difference between Input Phase 0 and Input Phase 6. This results in the phase difference between Output Phase 0 and Output Phase 3 to be twice the difference between Input Phase 0 and Input Phase 3. The output of flip-flop labeled '4' of FIG. 18 will be the same as the cnt_1 signal, except delayed with reference to Phase 0 of the output by an amount equal to the phase difference between Input Phase 0 and second rising edge of the Input Phase 0. This results in the phase difference between Output Phase 0 and Output Phase 4 to be twice the difference between Input Phase 0 and Input Phase 4.

At this instant, cnt_0 goes to logic '1' and cnt_1 goes to logic '0'. The D input of flip-flop labeled '5' follows at its output its input that was present prior to the rising edge of its clock, i.e. cnt_0. The output of flip-flop labeled '5' of FIG. 18 will be the same as the cnt_0 signal, except delayed with reference to Phase 0 of the output by an amount equal to the phase difference between Input Phase 0 and second rising edge of the Input Phase 2. Therefore, we get the Phase 5 waveform of the output waveform 1910 of FIG. 19. Similarly, the output of flip-flop labeled '6' of FIG. 18 will be the same as the cnt_0 signal, except delayed with reference to Phase 0 of the output by an amount equal to the phase difference between the first rising edge of Input Phase 0 and the second rising edge of the Input Phase 4. Thus we realize the desired objective of having the phase difference between Output Phase 0 and Output Phase 6 to be twice the difference between Input Phase 0 and Input Phase 6. Subsequently, the output of flip-flop labeled '7' of FIG. 18 will be the same as the cnt_0 signal, except delayed with reference to Phase 0 of the output by an amount equal to the phase difference between the first rising edge of the Input Phase 0 and second rising edge of Input Phase 6. This results in the phase difference between Output Phase 0 and Output Phase 7 to be twice the difference between Input Phase 0 and Input Phase 7.

Similarly, the output waveforms 1910 are generated with respect to the input waveforms 1905 for subsequent cnt_0 and cnt_1 states.

After the divide by 2 operation described in FIG. 18, the 8 output phases are generated by the clock divider circuit 1800. It is to be noted that the frequency of the output phases is halved as compared to the input phases. Further, the phase difference between two output phases is twice that of the corresponding input phases.

Figure 20:
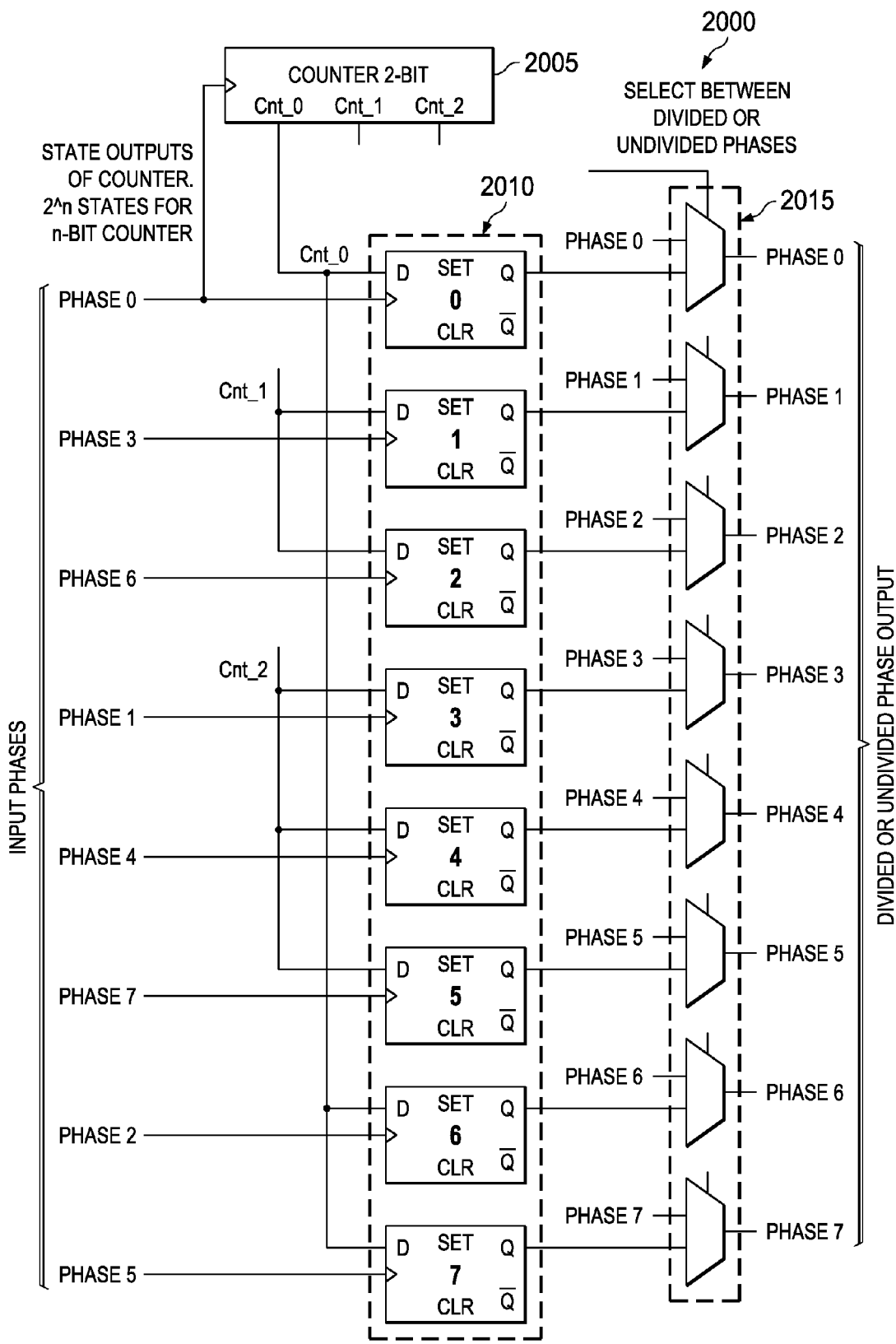
FIG. 20 is a block diagram of a divide-by-three clock divider circuit in accordance with another embodiment.

As in FIG. 20, a clock divider circuit 2000 for performing another divide by 3 operation is shown. The clock divider circuit 2000 includes a counter 2005, a group of flip-flops 2010 and a corresponding set of 2:1 multiplexers 2015.

The number of input phases is given as m=8 and the division factor K=3. The 8 input and output phases are identified as (Ph0, Ph1, Ph2 . . . . Ph7). The counter 2005 is a 2-bit counter with states cnt_0, cnt_1 and cnt_2 since c=ceil $(\log_2 K)$=2 bit. For 8 input phases, the group of flip-flops 2010 include 8 flip-flops labeled as FF{0, 1, 2 . . . 7}.

The clock inputs to each flip-flop is determined using [(K*FF_label) MOD m], where FF_label refers to the label of each flip-flop, for example a first flip-flop in the figure has a label '0'. Thereby, the input phases to successive flip-flops among the group of flip-flops 2010 are given as (Ph0, Ph3, Ph6, Ph1, Ph4, Ph7, Ph2, Ph5). Using such a sequence results in the phase difference between the output phases at Q output of each flip-flop being multiplied by a factor of 3. Further, the counter 2005 is clocked by the first input phase, i.e. Ph0.

One of the states of the counter 2005 is latched to each flip-flop of the set of flip-flops 2010. State to be latched to each flip-flop is determined by grouping one or flip-flops in sets and associating the state to each sets. The number of sets is equal to [min(K, m)=3]. The maximum number of flip-flops associated with a single set is determined as p=(Ceil(m/K))= 3. Further, each set includes flip-flops that have consecutive labels.

For each flip-flop, a z-value is determined. The z-value=z= (ceil(nK/m)) mod K, where n is the label associated with the flip-flop. All output waveforms with the same z-value form a set.

Here, K=3 and phases m=8, the number of sets S=3. The sets being denoted as S={S1, S2, S3}.

| | Output Waveform Label (n) | | | | | | | |
|---|---|---|---|---|---|---|---|---|
| | 0 | 1 | 2 | 3 | 4 | 5 | 6 | 7 |
| z-value | 0 | 1 | 1 | 2 | 2 | 2 | 0 | 0 |

Thus in this case the sets are the sets are classified as S1={1,2}, S2={3,4,5} and S3={6,7,0}, where {0,1,2,3,4,5,6, 7} refers to the labels of the flip-flops.

Having formed the sets of output phases, Method 2 now simply calls for driving the D-flip-flop with label n with its corresponding cnt_z waveform.

For set S1, the counter state is determined as cnt_1. For set S2, the counter state is determined as cnt_2. For set S2, the counter state is determined as cnt_1. Consecutively, flip-flops associated with set S1 are latched to a cnt_1. Similarly, flip-flops associated with the set S2 are latched to a cnt_2. Similarly, flip-flops associated with the set S3 are latched to a cnt_0. Utilizing the counter states as D-input as mentioned herein results in the clock period of output phases multiplied by a factor 3.

The flip-flops labeled {0,1,2,3,4,5,6,7} output a divided output phases {Ph0, Ph1, Ph2, Ph3, Ph4, Ph 5, Ph6, Ph7} respectively. The clock period of the output phases are multiplied by the factor 2.

In an embodiment, the clock divider circuit 2000 can be operable to perform selection of divided or undivided phases (input phases) using the set of 2:1 multiplexers 2015. Each divided output phase is input to a first input of a 2:1 multiplexer individually by coupling the Q output of the flip-flops to the first input of the set of 2:1 multiplexers 2015. A second input of the set of 2:1 multiplexers 2015 receives the undivided phases (input phases) as input. A select line to the multiplexer can be used in selecting either of the first input or the second input.

Figure 21:
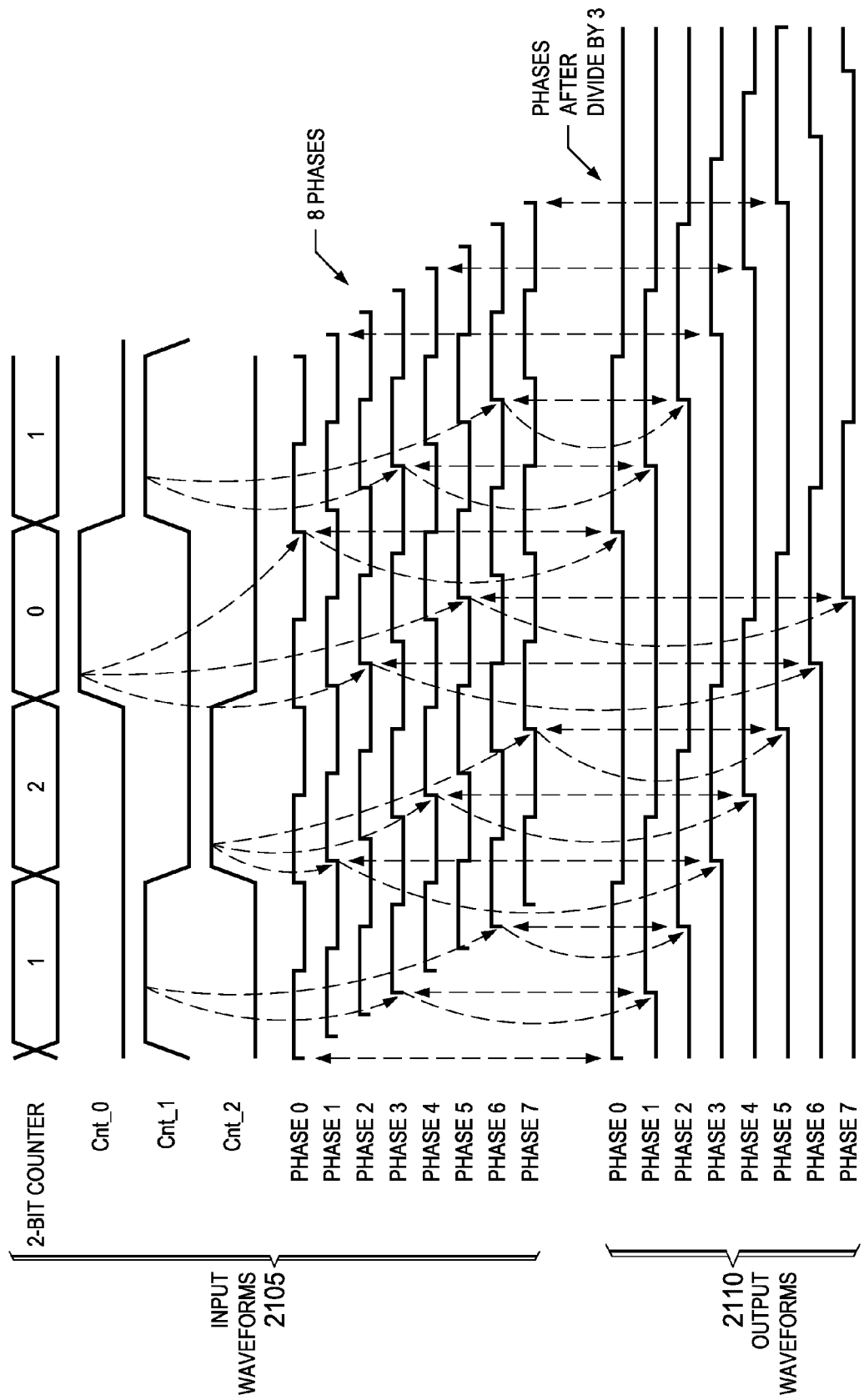
FIG. 21 is an illustration of a divide-by-three operation on 8 clock signals all of the same frequency, each signal after the first being phase-shifted from the phase of the previous one by 1/8 of a period.

FIG. 21 is an illustration of a divide-by 3 m-equidistant phase clock signals for the clock divider circuit 2000.

The upper half of the FIG. 21 represents input waveforms to divide by 3 clock divider circuits, and the lower half represents output waveforms from the divide by 3 clock divider circuits. The input waveforms include signal generated from a 2-bit counter, signals corresponding to individual states of the 2-bit counter (cnt_0, cnt_1 and cnt_2) and 8 input phases. Each input phase (after the first input phase) having a phase offset of π/4 from the previous input phase, where 2π represents the phase change over one period of the Phase 0 waveform of the Input Waveform Set. The frequency of the input phases is predefined.

The cnt_0 waveform generated by the 2-bit counter in FIG. 20 experiences a rising edge only upon a rising edge of the clock input to the 2-bit counter, which is Phase 0 of the input waveform set of FIG. 21. Therefore the UP-TIME, that is, the duration for which cnt_0 is at Logical 1, is same as the period of Phase 0 of the input waveform set. However cnt_0 does not rise again until a total of K=3 clock periods have passed. The same statements hold for cnt_1 and cnt_2, which is offset from cnt_0 by one clock period and two clock period respectively.

The output of flip-flop labeled '0' of FIG. 20 will be the same as the cnt_0 signal, except delayed by a period equal to the period of the Phase 0 waveform of the input waveform 2105. Here, no delay is present and the output of flip-flop labeled '0' will immediately follow the cnt_0 signal. Therefore, we get the Phase 0 waveform of the output waveform 2110 of FIG. 21. The output of flip-flop labeled '6' of FIG. 20 will be the same as the cnt_0 signal, except delayed with reference to Phase 0 of the output by an amount equal to the phase difference between the first rising edge of Input Phase 0 and the third rising edge of the Input Phase 2. Thus we realize the desired objective of having the phase difference between Output Phase 0 and Output Phase 6 to be thrice the difference between Input Phase 0 and Input Phase 6. Subsequently, the output of flip-flop labeled '7' of FIG. 20 will be the same as the cnt_0 signal, except delayed with reference to Phase 0 of the output by an amount equal to the phase difference between the first rising edge of the Input Phase 0 and third rising edge of Input Phase 5. This results in the phase difference between Output Phase 0 and Output Phase 7 to be thrice the difference between Input Phase 0 and Input Phase 7.

At the instant when cnt_0 goes to logic '0', cnt_1 goes to logic '1' and cnt_2 is at logic '0'. The output of flip-flop labeled '1' of FIG. 20 will be the same as the cnt_1 signal, except delayed with reference to Phase 0 of the output by an amount equal to the phase difference between Input Phase 0 and Input Phase 3. Thus we realize the desired objective of having the phase difference between Output Phase 0 and Output Phase 1 to be thrice the difference between Input Phase 0 and Input Phase 1. Subsequently, the output of flip-flop labeled '2' of FIG. 20 will be the same as the cnt_1 signal, except delayed with reference to Phase 0 of the output by an amount equal to the phase difference between Input Phase 0 and Input Phase 6. This results in the phase difference between Output Phase 0 and Output Phase 2 to be thrice the difference between Input Phase 0 and Input Phase 2.

At the instant when cnt_1 goes to logic '0', cnt_2 goes to logic '1' and cnt_0 is at logic '0'. the output of flip-flop labeled '3' of FIG. 20 will be the same as the cnt_2 signal, except delayed with reference to Phase 0 of the output by an amount equal to the phase difference between Input Phase 0 and second rising edge of the Input Phase 1. Therefore, we get the Phase 3 waveform of the output waveform 2110 of FIG. 21. Similarly, the output of flip-flop labeled '4' of FIG. 20 will be the same as the cnt_2 signal, except delayed with reference to Phase 0 of the output by an amount equal to the phase difference between the first rising edge of Input Phase 0 and the second rising edge of the Input Phase 4. Thus we realize the desired objective of having the phase difference between Output Phase 0 and Output Phase 4 to be thrice the difference between Input Phase 0 and Input Phase 4. Subsequently, the output of flip-flop labeled '5' of FIG. 20 will be the same as the cnt_2 signal, except delayed with reference to Phase 0 of the output by an amount equal to the phase difference between the first rising edge of the Input Phase 0 and second rising edge of Input Phase 7. This results in the phase difference between Output Phase 0 and Output Phase 7 to be thrice the difference between Input Phase 0 and Input Phase 7.

Similarly, the output waveforms 2110 are generated with respect to the input waveforms 2105 for subsequent cnt_0, cnt_1 and cnt_2 states.

After the divide by 3 operation described in FIG. 20, the 8 output phases are generated by the clock divider circuit 2000. It is to be noted that the frequency of the output phases is divided by three as compared to the input phases. Further, the phase difference between two output phases is thrice that of the corresponding input phases.

Figure 22:
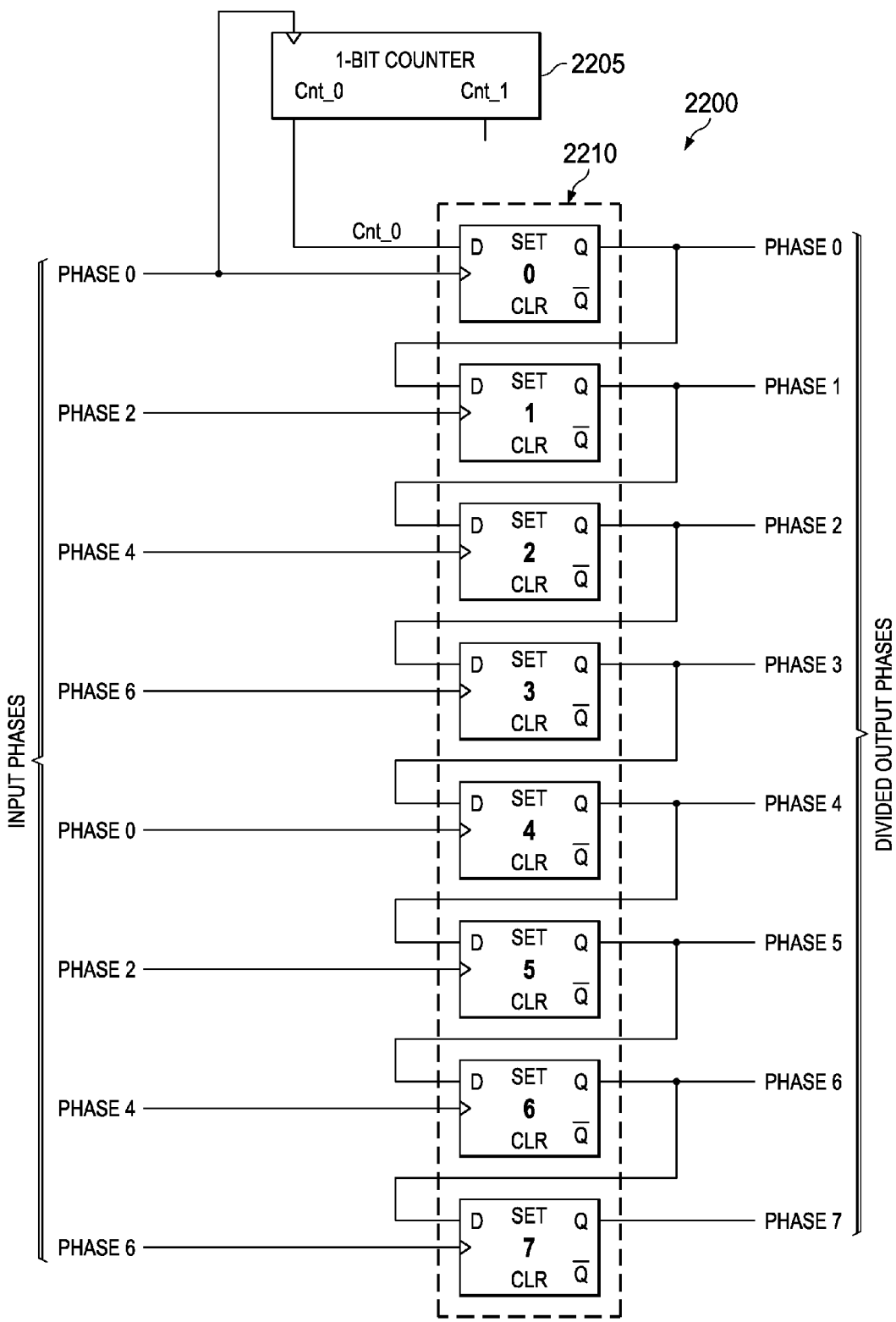
FIG. 22 is a block diagram of a divide-by-two clock divider circuit in accordance with another embodiment.

As in FIG. 22, a clock divider circuit 2200 for performing a divide by 2 operation is shown. The clock divider circuit 2200 includes a counter 2205 and a group of flip-flops 2210.

The number of input phases is given as m=8 and the division factor K=2. The 8 input and output phases are identified as (Ph0, Ph1, Ph2 . . . . Ph7). The counter 2205 is a 1-bit counter with states cnt_0 and cnt_1 since c=[ceil(log$_2$K)]=1 bit. Here, only a single counter state is used. For 8 input phases, the group of flip-flops 2210 include 8 flip-flops labeled as FF{0, 1, 2 . . . 7}.

The clock inputs to each flip-flop is determined using [(K* (FF_label) MOD m)], where FF_label refers to the label of each flip-flop, for example a first flip-flop in the figure has a label '0'. Thereby, the input phases to successive flip-flops among the group of flip-flops 2210 are given as (Ph0, Ph2, Ph4, Ph6, Ph0, Ph2, Ph4, Ph6). Using such a sequence results in the phase difference between the output phases at Q output of each flip-flop being multiplied by a factor of 2 as compared to the corresponding input phases.

The counter 2205 is clocked by the first input phase, i.e Ph0. The flip-flop with label '0' is latched to a cnt_0 of the counter. Consecutively, Q output of flip-flop with label '0' is latched to the D-input of the flip-flop with the next label (flip-flop label '1'). Similarly, each Q output of the flip-flop is latched to the D-input of the subsequent flip-flop. Utilizing cnt_0 as latching input to a first flip-flop and coupling Q output of each flip-flop to the input of the subsequent flip-flop results in the clock period of output phases multiplied by a factor 2.

Figure 23:
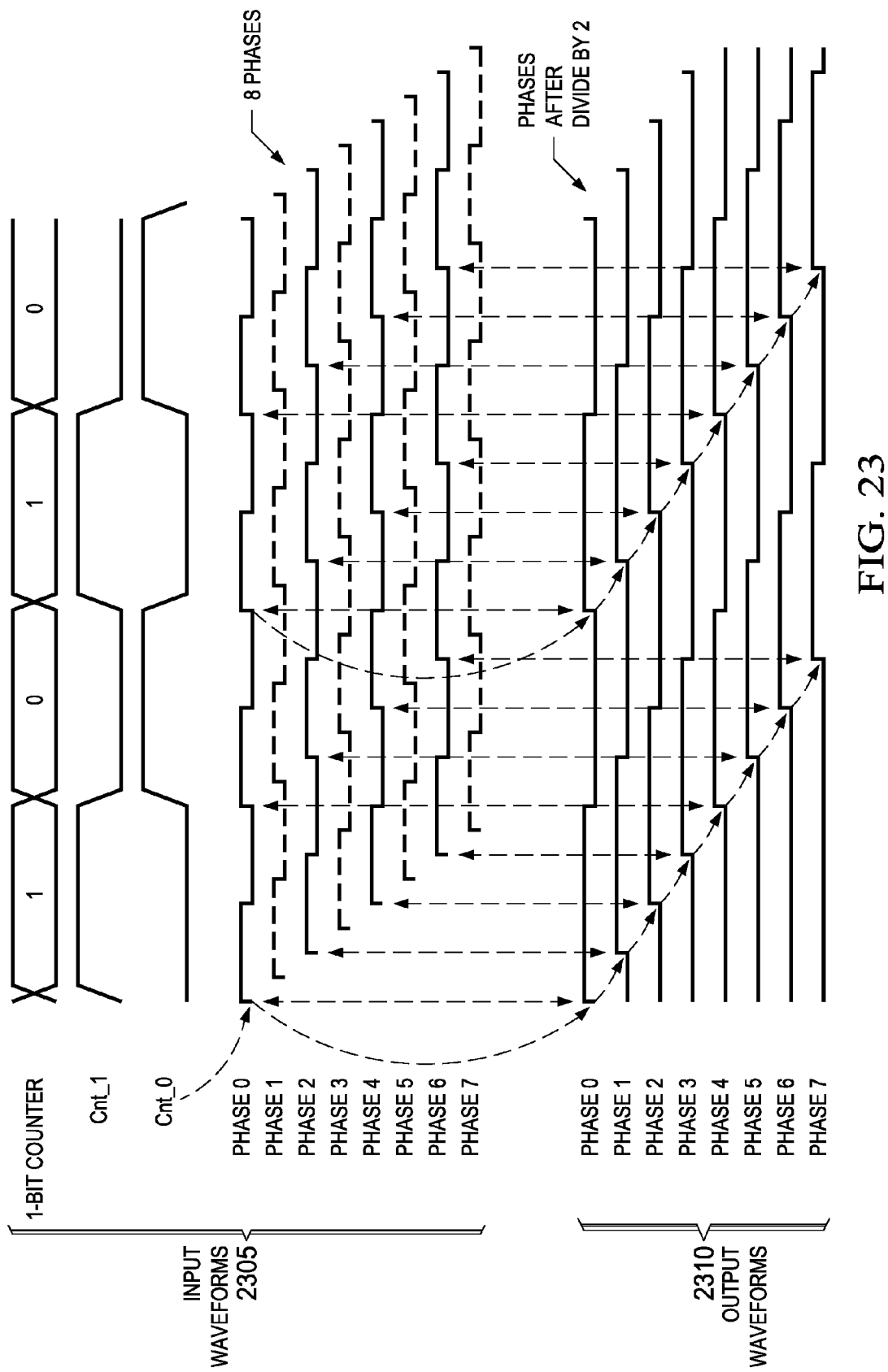
FIG. 23 is an illustration of a divide-by-two operation on 8 clock signals all of the same frequency, each signal after the first being phase-shifted from the phase of the previous one by 1/8 of a period.

FIG. 23 is an illustration of another divide-by 2 m-equidistant phase clock signals for the clock divider circuit 2200.

The upper half of the FIG. 23 represents input waveforms 2305 to divide by 2 clock divider circuits, and the lower half represents output waveforms 2310 from the divide by 2 clock divider circuits. The input waveforms 2305 include signal generated from a 1-bit counter, signals corresponding to individual states of the 1-bit counter (cnt_0 and cnt_1) and 8 input phases. Each input phase (after the first input phase) having a phase offset of π/4 from the previous input phase. The frequency of the input phases is predefined. Here, only a single state of the counter is latched to a flip-flop.

In as much as a D flip-flop follows at it output its input just prior to the rising edge of its clock, the Output Phase 0 of FIG. 23 is a delayed version of Cnt0.

The output phases of group of flip-flops 2210 in FIG. 22 (other than Output Phase 0) follow the output phase immediately previous to itself, except delayed by the phase difference between phase input to its D input and phase input to its clock. For example, phase difference between Output Phase 0 and Output Phase 1 is twice the difference between Input Phase 0 and Input Phase 1. Likewise all the outputs from Output Phase 1 through 7 have periods twice that of the input waveforms.

After the divide by 2 operation described in FIG. 22, the 8 output phases are generated by the clock divider circuit 2200. It is to be noted that the frequency of the output phases is halved as compared to the input phases. Further, the phase difference between consecutive output phases is twice that of the input phases.

Figure 24:
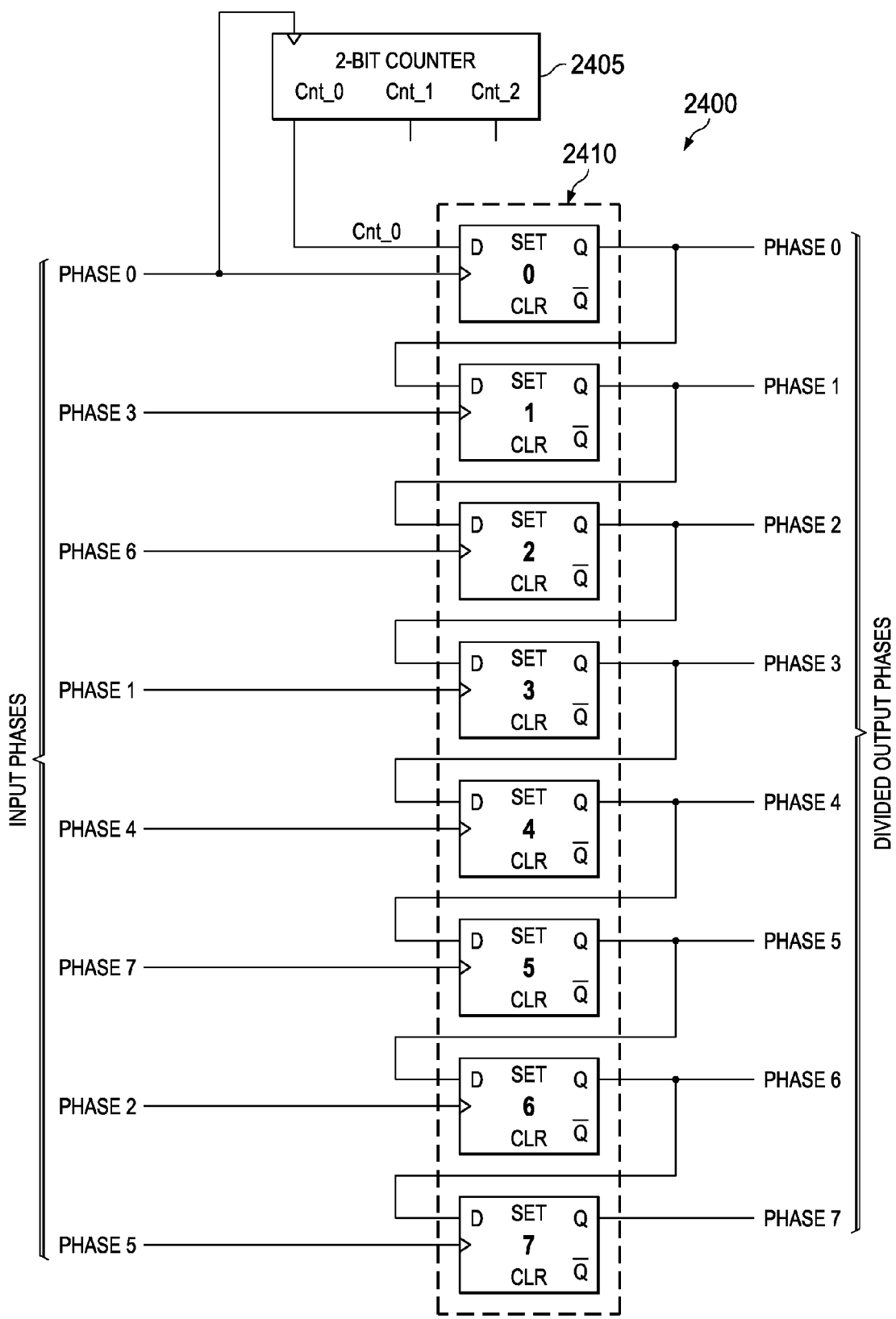
FIG. 24 is a block diagram of a divide-by-three clock divider circuit in accordance with another embodiment.

As in FIG. 24, a clock divider circuit 2400 for performing a divide by 3 operation is shown. The clock divider circuit 2400 includes a counter 2405 and a group of flip-flops 2410.

The number of input phases is given as m=8 and the division factor K=3. The 8 input and output phases are identified as (Ph0, Ph1, Ph2 . . . . Ph7). The counter 2405 is a 2-bit counter with states cnt_0, cnt_1 and cnt_2 since c=[ceil (log$_2$K)]=2 bit. Here, only a single counter state is used. For 8 input phases, the group of flip-flops 2410 include 8 flip-flops labeled as FF{0, 1, 2 . . . 7}.

The clock inputs to each flip-flop is determined using [(K* (FF_label) MOD m)], where FF_label refers to the label of each flip-flop, for example a first flip-flop in the figure has a label '0'. Thereby, the input phases to successive flip-flops among the group of flip-flops 2410 are given as (Ph0, Ph3, Ph6, Ph1, Ph4, Ph7, Ph2, Ph5). Using such a sequence results in the phase difference between the output phases at Q output of each flip-flop being multiplied by a factor of 3 as compared to the corresponding input phases.

The counter 2405 is clocked by the first input phase, i.e. Ph0. The flip-flop with label '0' is latched to a cnt_0 of the counter. Consecutively, Q output of flip-flop with label '0' is latched to the D-input of the flip-flop with the next label (flip-flop label '1'). Similarly, each Q output of the flip-flop is latched to the D-input of the subsequent flip-flop. Utilizing cnt_0 as latching input to a first flip-flop and coupling Q output of each flip-flop to the input of the subsequent flip-flop results in the clock period of output phases multiplied by a factor 3.

Figure 25:
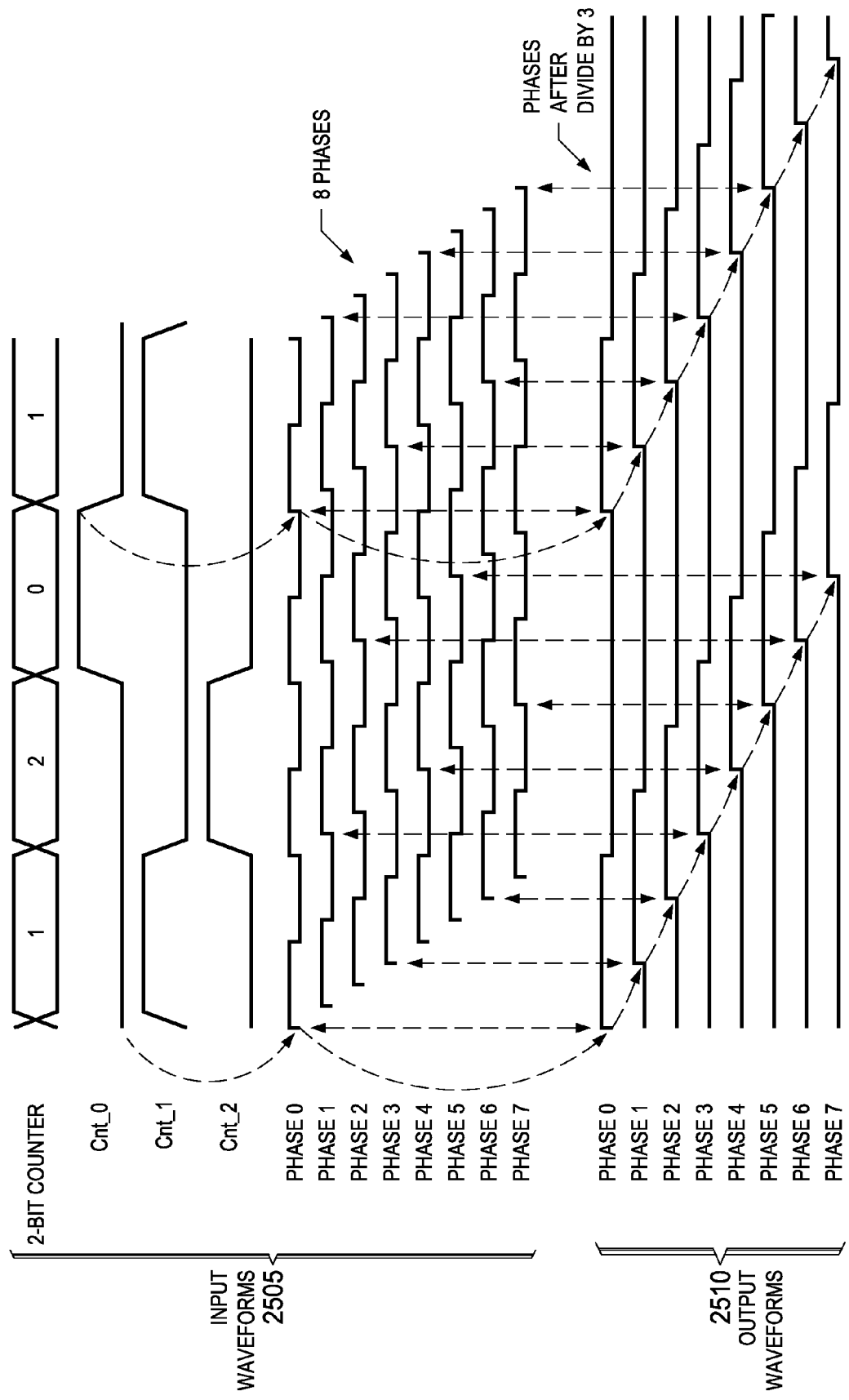
FIG. 25 is an illustration of a divide-by-three operation on 8 clock signals all of the same frequency, each signal after the first being phase-shifted from the phase of the previous one by 1/8 of a period.

FIG. 25 is an illustration of another divide-by 3 m-equidistant phase clock signals for the clock divider circuit 2400.

The upper half of the FIG. 25 represents input waveforms 2505 to divide by 3 clock divider circuits, and the lower half represents output waveforms 2510 from the divide by 3 clock divider circuits. The input waveforms 2505 include signal generated from a 2-bit counter, signals corresponding to individual states of the 2-bit counter (cnt_0, cnt_1 and cnt_2) and 8 input phases. Each input phase (after the first input phase) having a phase offset of $\pi/4$ from the previous input phase. The frequency of the input phases is predefined. Here, only a single state of the counter is latched to a flip-flop.

In as much as a D flip-flop follows at it output its input just prior to the rising edge of its clock, the Output Phase 0 of FIG. 25 is a delayed version of Cnt0.

The output phases of group of flip-flops 2410 in FIG. 24 (other than Output Phase 0) follow the output phase immediately previous to itself, except delayed by the phase difference between phase input to its D input and phase input to its clock. For example, phase difference between Output Phase 0 and Output Phase 1 is thrice the difference between Input Phase 0 and Input Phase 1. Likewise all the outputs from Output Phase 1 through 7 have periods thrice that of the input waveforms.

After the divide by 2 operation described in FIG. 24, the 8 output phases are generated by the clock divider circuit 2400. It is to be noted that the frequency of the output phases is divided by 3 as compared to the input phases. Further, the phase difference between consecutive output phases is thrice that of the input phases.

Figure 26:
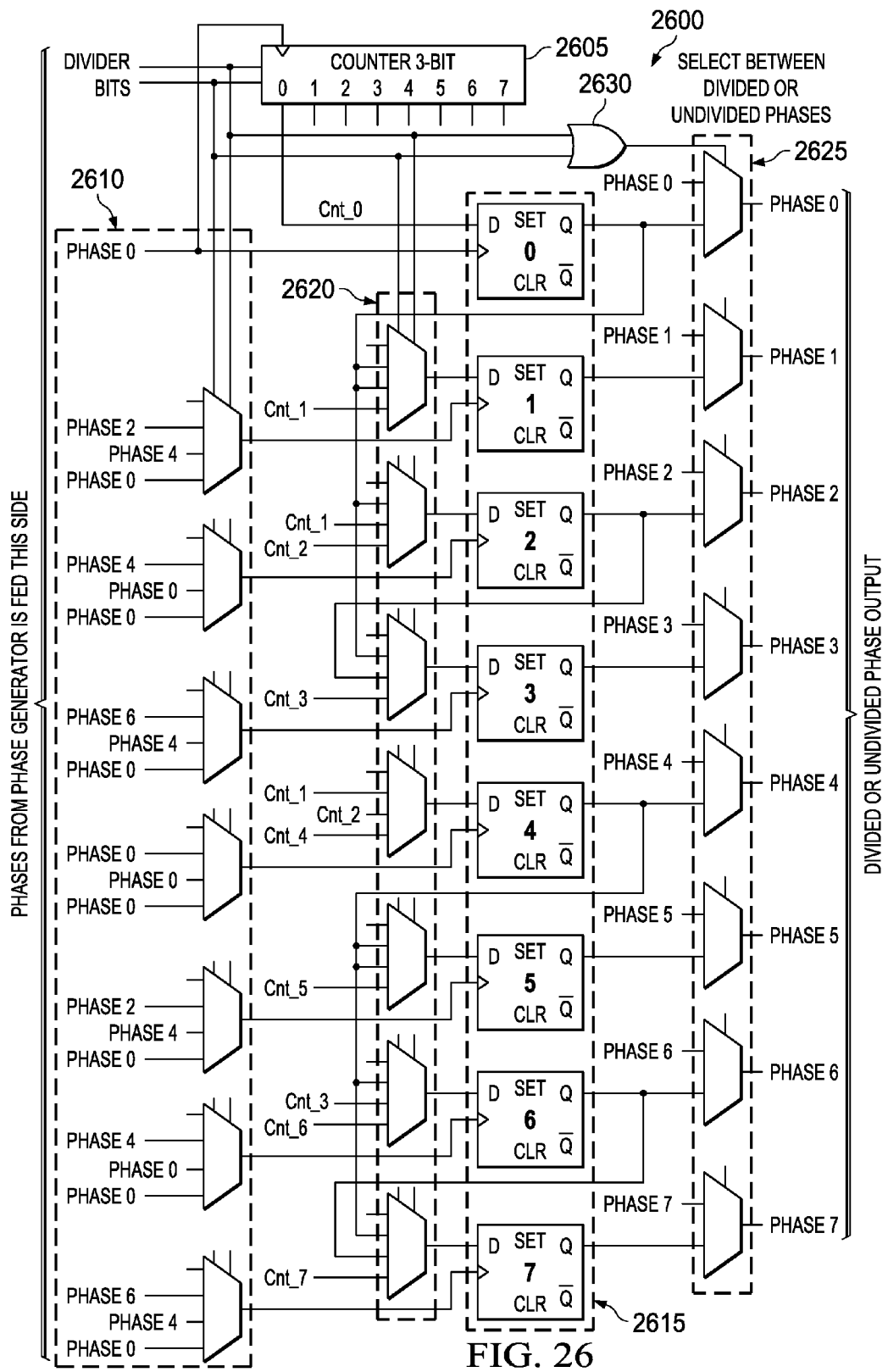
FIG. 26 is a block diagram of a clock divider circuit that performs a programmable frequency division operation, in accordance with one embodiment.

As in FIG. 26, a clock divider circuit 2600 programmable to perform one of a divide by 1, divide by 2, divide by 4 or divide by 8 operation is shown. The clock divider circuit 2600 includes a counter 2605, a first set of multiplexer 2610, a group of flip-flops 2615, a second set of multiplexers 2620 and a third set of multiplexers 2625.

The number of input phases is given as m=8. The 8 input and output phases are identified as (Ph0, Ph1, Ph2 ... Ph7). The counter 2605 is a 3-bit counter since c=[ceil (log$_2$K)]=3 bits, using the maximum value of K=8. For 8 input phases, the group of flip-flops 2610 include 8 flip-flops labeled as FF{0, 1, 2 ... 7}. The input phases are provided as input to the first set of multiplexers 2610. Based on a frequency division to be performed, the first set of multiplexers 2610 select one of the input phases to be output to a clocking input of the group of flip-flops 2615. The clock inputs to each flip-flop is determined using [(K*(FF_label) MOD m)], where K refers to a division factor and FF_label refers to the label of each flip-flop. For example, for a divide by 2 operation, division factor K=2. The selection of K=2 results in the first set of multiplexers 2610 to output the input phases (Ph0, Ph2, Ph4, Ph6, Ph0, Ph2, Ph4, Ph6) as the clocking input to the flip-flops labeled {0,1,2,3,4,5,6,7} respectively.

For a divide by 4 operation, division factor K=4. The first set of multiplexers 2610 output the input phases (Ph0, Ph4, Ph0, Ph4, Ph0, Ph4, Ph0, Ph4) as the clocking input to the flip-flops labeled {0,1,2,3,4,5,6,7} respectively.

For a divide by 8 operation, division factor K=8. The first set of multiplexers 2610 output the input phase (Ph0) as the clocking input to the flip-flops labeled {0,1,2,3,4,5,6,7} respectively.

As an example, a divide by 2 operation is selected. Thereby, the input phases to successive flip-flops among the group of flip-flops 2610 are selected as (Ph0, Ph2, Ph4, Ph6, Ph0, Ph2, Ph4, Ph6). Using such a sequence results in the phase difference of the output phases at Q output of each flip-flop being multiplied by a factor of 2. The counter 2605 is clocked by the first input phase, i.e Ph0. The flip-flop with label '0' is latched to a cnt_0 of the counter. The flip-flops labeled {1,2,3,4,5,6,7} are latched to a corresponding multiplexer among the second set of multiplexers 2620. The second set of multiplexer can be 8:1 multiplexers. Consecutively, Q output of flip-flop with label '0' is latched to a first multiplexer, a second multiplexer and a third multiplexer of the second set of multiplexers 2620. A cnt_1 is connected to the fourth multiplexer whose output is latched to the flip-flop with label '4'. Consecutively, Q output of flip-flop with label '4' is latched to a fifth multiplexer, a sixth multiplexer and a seventh multiplexer of the second set of multiplexers 2620. Utilizing a sequence of D-inputs and clocking inputs to the group of flip-flops 2610 results in the clock period of output phases multiplied by a factor 2.

In an embodiment, the clock divider circuit 2600 can be operable to perform selection of divided or undivided phases (input phases or divide by 1 operation) using the set of 2:1 multiplexers 2620. Each divided output phase is input to a first input of a 2:1 multiplexer individually by coupling the Q output of the flip-flops to the first input of the set of 2:1 multiplexers 2620. A second input of the set of 2:1 multiplexers 2620 receives the undivided phases (input phases) as input. A select line to the multiplexer can be used in selecting either of the first input or the second input. A divider bits corresponding to clock division operation are provided as inputs to a OR gate 2630. If and only if the output of the OR gate 2630 is logical 0 we select the undivided phases.

Figure 27:
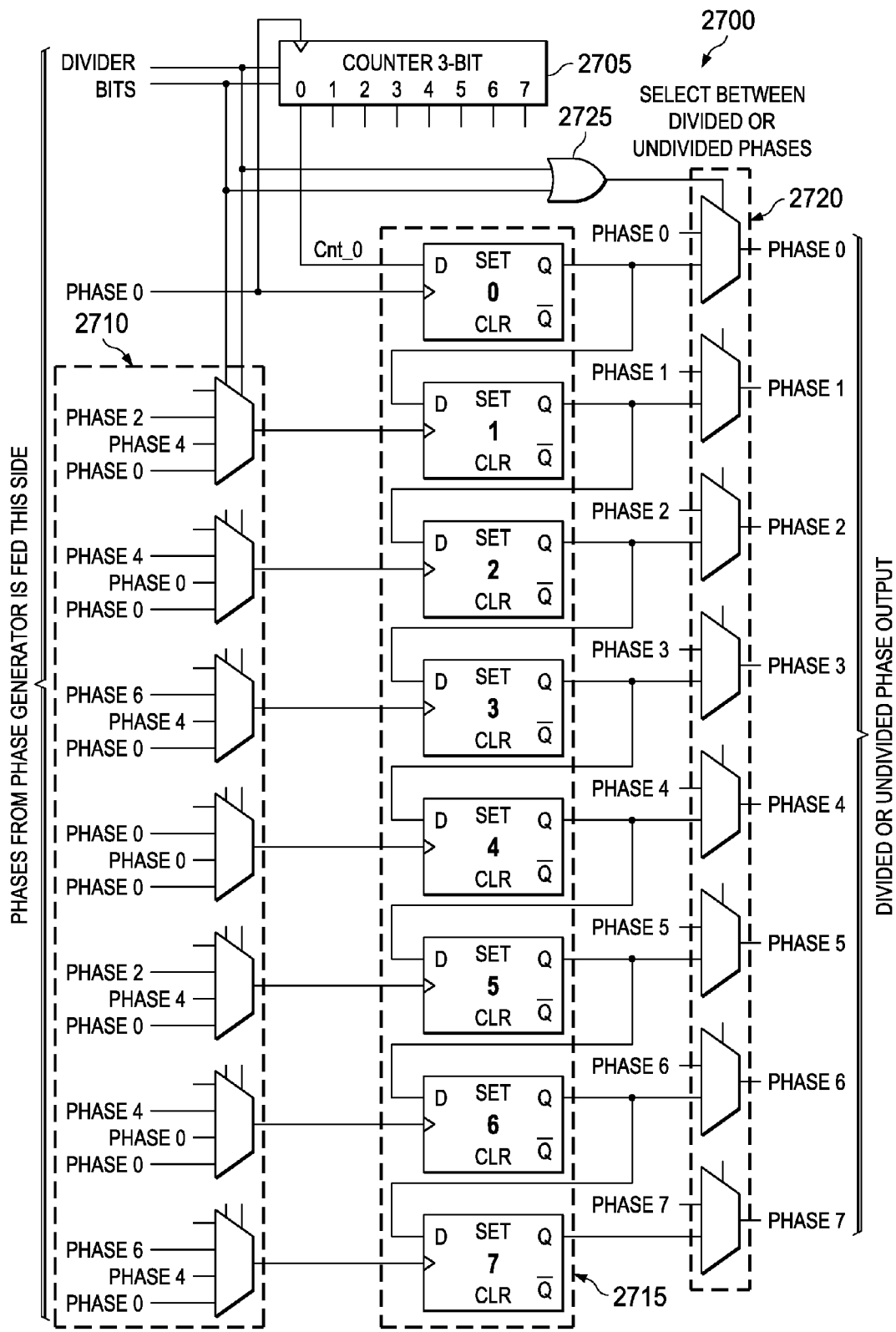
FIG. 27 is a block diagram of a clock divider circuit that performs a programmable frequency division operation, in accordance with another embodiment.

As in FIG. 27, a clock divider circuit 2700 programmable to perform one of a divide by 1, divide by 2, divide by 4 or divide by 8 operation is shown. The clock divider circuit 2700 includes a counter 2705, a first set of multiplexer 2710, a group of flip-flops 2715 and a second set of multiplexers 2720.

The number of input phases is given as m=8. The 8 input and output phases are identified as (Ph0, Ph1, Ph2 ... Ph7). The counter 2705 is a 3-bit counter. For 8 input phases, the group of flip-flops 2710 include 8 flip-flops labeled as FF{0, 1, 2 ... 7}. The input phases are provided as input to the first set of multiplexers 2710. Based on a frequency division to be performed, the first set of multiplexers 2710 select one of the input phases to be output to a clocking input of the group of flip-flops 2715. The clock inputs to each flip-flop is determined using [(K*(FF_label) MOD m)], where K refers to a division factor and FF_label refers to the label of each flip-flop. For example, for a divide by 2 operation, division factor K=2. The selection of K=2 results in the first set of multiplexers 2710 to output the input phases (Ph0, Ph2, Ph4, Ph6, Ph0, Ph2, Ph4, Ph6) as the clocking input to the flip-flops labeled {0,1,2,3,4,5,6,7} respectively.

For a divide by 4 operation, division factor K=4. The first set of multiplexers 2710 output the input phases (Ph0, Ph4, Ph0, Ph4, Ph0, Ph4, Ph0, Ph4) as the clocking input to the flip-flops labeled {0,1,2,3,4,5,6,7} respectively.

As an example, consider that a divide by 2 operation is selected. Thereby, the input phases to successive flip-flops among the group of flip-flops 2710 are given as (Ph0, Ph2, Ph4, Ph6, Ph0, Ph2, Ph4, Ph6). Using such a sequence results in the phase difference of the output phases at Q output of each flip-flop being multiplied by a factor of 2.

The counter 2705 is clocked by the first input phase, i.e. Ph0. The flip-flop with label '0' is latched to a cnt_0 of the counter. Consecutively, Q output of flip-flop with label '0' is latched to the D-input of the flip-flop with the next label (flip-flop label '1'). Similarly, each Q output of the flip-flop is latched to the D-input of the subsequent flip-flop. Utilizing cnt_0 as latching input to a first flip-flop and coupling Q output of each flip-flop to the input of the subsequent flip-flop results in the clock period of output phases multiplied by a factor 2.

In an embodiment, the clock divider circuit 2700 can be operable to perform selection of divided or undivided phases (input phases or divide by 1 operation) using the set of 2:1 multiplexers 2720. Each divided output phase is input to a first input of a 2:1 multiplexer individually by coupling the Q output of the flip-flops to the first input of the set of 2:1 multiplexers 2720. A second input of the set of 2:1 multiplexers 2720 receives the undivided phases (input phases) as input. A select line to the multiplexer can be used in selecting either of the first input or the second input. A divider bits corresponding to clock division operation are provided as inputs to a OR gate 2725. If and only if the output of the OR gate 2725 is logical 0 do we select the undivided phases.

Using the clock divider circuits disclosed in the present disclosure, multi-phase clock signals are obtained by means of a clock divider in a digital module using a single state machine. This has been achieved with minimal integrated circuit surface area and with minimal circuit complexity.

In the foregoing discussion, each of the terms "coupled" and "connected" refers to either a direct electrical connection or mechanical connection between the devices connected or an indirect connection through intermediary devices.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A clock divider that receives m input clock signals each of the same frequency, each input clock signal after the first having a phase offset of $2\pi/m$, with $2\pi$ radians being the phase change in one period of the clock, from the previous input clock signal, and divides the frequency of the input clock signals by an integer of division K, the divider comprising:
    a counter that receives the first input clock signal and provides one or more count signals; and
    m flip-flops, of which a first flip-flop receives the first input clock signal at its clock input and provides a first clock output signal, and each flip-flop after the first receives an input clock signal at its clock input and provides a clock output signal, each clock output signal after the first having a $2\pi K/m$ phase offset from the previous clock output signal, each flip-flop having a D input that receives a D-input signal comprising one of (1) a count signal and (2) a clock output signal from one of the other flip-flops;
    wherein:
    the integer of division is programmable;
    the counter provides a plurality of count signals; and
    the D input of the first flip-flop receives a zero-count signal; and the divider further comprises:
    m−1 clock-input multiplexers, each flip-flop after the first receiving its input clock signal through an associated one of the clock-input multiplexers, each clock-input multiplexer responsive to a control signal determined by the programmable integer of division to select one of a plurality of the input clock signals for its associated flip-flop; and
    m−1 D-input multiplexers, each flip-flop after the first receiving its D-input signal through a corresponding one of the D-input multiplexers, each D-input multiplexer responsive to the control signal to select one of a plurality of the count signals and the clock output signals for its associated flip-flop;
    whereby each clock output signal after the first has a phase offset of $2\pi/m$ from the previous clock output signal, and the frequency of the clock output signals is determined by the programmable integer of division.

* * * * *